(12) United States Patent
Narku-Tetteh et al.

(10) Patent No.: US 12,154,623 B2
(45) Date of Patent: Nov. 26, 2024

(54) TECHNOLOGIES FOR CONTROLLING CURRENT THROUGH MEMORY CELLS

(71) Applicant: Intel Corporation, Santa Clara, CA (US)

(72) Inventors: Noble Narku-Tetteh, Rancho Cordova, CA (US); Yasir Mohsin Husain, Folsom, CA (US); Ripudaman Singh, Folsom, CA (US); Nicolas L. Irizarry, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 765 days.

(21) Appl. No.: 17/184,462

(22) Filed: Feb. 24, 2021

(65) Prior Publication Data

US 2022/0270680 A1    Aug. 25, 2022

(51) Int. Cl.
*G11C 13/00* (2006.01)
(52) U.S. Cl.
CPC ........ *G11C 13/004* (2013.01); *G11C 13/0097* (2013.01); *G11C 2013/0045* (2013.01); *G11C 2213/71* (2013.01); *G11C 2213/79* (2013.01)
(58) Field of Classification Search
CPC .............. G11C 13/004; G11C 13/0097; G11C 2013/0045; G11C 2213/71; G11C 2213/79; G11C 2013/0078; G11C 13/0038; G11C 2013/0092; G11C 13/0069; G11C 13/0004; G11C 7/12; G11C 8/08
See application file for complete search history.

(56) References Cited

U.S. PATENT DOCUMENTS

| 4,389,713 | A  | * | 6/1983 | Patel ................. | G11C 13/0069 365/163 |
| 7,773,409 | B2 | * | 8/2010 | Chen ................. | G11C 13/0069 365/100 |
| 2006/0221679 | A1 | * | 10/2006 | Kang ................. | G11C 13/0069 365/163 |
| 2008/0130352 | A1 | * | 6/2008 | Scheuerlein ....... | G11C 13/0069 365/163 |

(Continued)

OTHER PUBLICATIONS

U.S. Appl. No. 17/706,943, filed Mar. 29, 2022 entitled, Technologies for Dynamic Biasing for Memory Cells (51 pages).

(Continued)

*Primary Examiner* — Khamdan N. Alrobaie
(74) *Attorney, Agent, or Firm* — Alliance IP, LLC

(57) ABSTRACT

Techniques for controlling current through memory cells is disclosed. In the illustrative embodiment, a fine-grained current source and a coarse-grained current source can both be activated to perform an operation on a phase-change memory cell. The coarse-grained current source is briefly activated to charge up the capacitance of an electrical path through the memory cell and then turned off. The fine-grained current source applies a current pulse to perform the operation on the memory cell, such as a reset operation. By charging up the electrical path quickly with the coarse-grained current source, the fine-grained current source can quickly perform the operation on the memory cell, reducing the thermal disturbance caused by the operation on nearby memory cells.

17 Claims, 11 Drawing Sheets

(56) References Cited

U.S. PATENT DOCUMENTS

| | | | | |
|---|---|---|---|---|
| 2008/0219046 | A1* | 9/2008 | Chen | G11C 13/0069 |
| | | | | 365/163 |
| 2009/0010047 | A1* | 1/2009 | Sheu | G11C 13/0069 |
| | | | | 365/163 |
| 2016/0042788 | A1* | 2/2016 | Ahn | G11C 13/0069 |
| | | | | 365/148 |
| 2021/0118502 | A1* | 4/2021 | Janjua | G11C 13/0004 |

OTHER PUBLICATIONS

Choi, Sukhwan, et al.; "Auto-Scaling Overdrive Method Using Adaptive Charge Amplification for PRAM Write Performance Enhancement," IEEE Transactions on Circuits and Systems; Nov. 2014; 10 pages.

Choi, Youngdon, et al.; "A 20nm 1.8b 8Gb PRAM with 40 MB/s Program Bandwidth," 2012 IEEE International Solid State Circuits Conference; Feb. 2012; 3 pages.

EPO; Extended European Search Report issued in EP Patent Application No. 22151354.2, dated Jun. 15, 2022; 11 pages.

* cited by examiner

TECHNOLOGIES FOR CONTROLLING CURRENT THROUGH MEMORY CELLS

BACKGROUND

In certain circuits such as phase-change memory cells, fine-grained control of amplitude and duration of current pulse through a component may be desired. For example, a short pulse of high current density through a memory cell may change the phase of the memory cell, changing or resetting the value stored by the memory cell.

In some cases, several different components can be selected to be driven by the same current source. However, electrical paths through the different components may have different values of capacitance and resistance. As such, in order to control the current through the selected component, the current source must take into account the capacitance and/or resistance of the electrical path through the selected component.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

Figure 1:
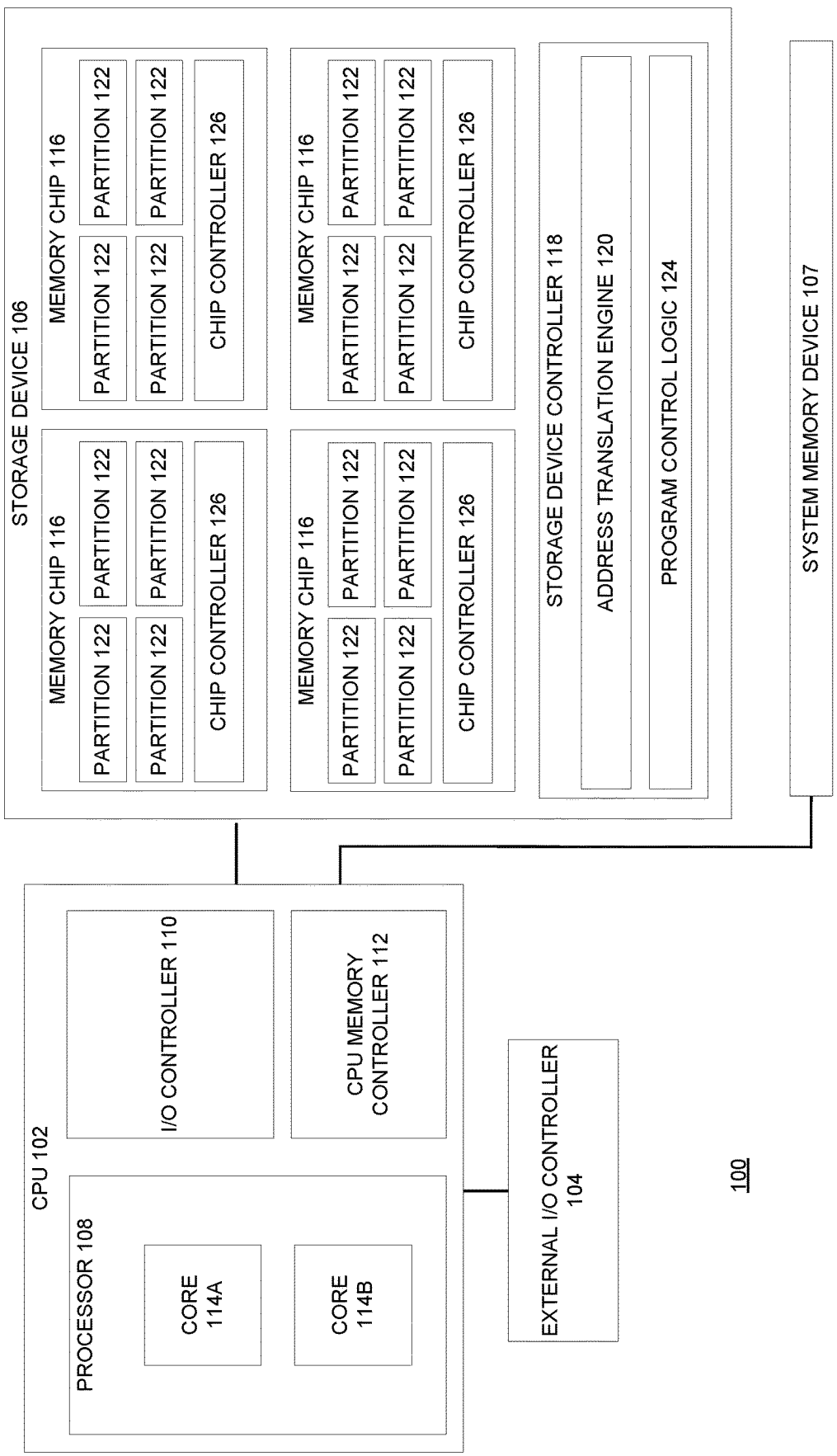
FIG. 1 illustrates components of a computer system in accordance with certain embodiments.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C); (A and B); (A and C); (B and C); or (A, B, and C). Similarly, items listed in the form of "at least one of A, B, or C" can mean (A); (B); (C); (A and B); (A and C); (B and C); or (A, B, and C).

The disclosed embodiments may be implemented, in some cases, in hardware, firmware, software, or any combination thereof. The disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Although the drawings depict particular computer systems, the concepts of various embodiments are applicable to any suitable computer systems. Examples of systems in which teachings of the present disclosure may be used include desktop computer systems, server computer systems, storage systems, handheld devices, tablets, other thin notebooks, system on a chip (SOC) devices, and embedded applications. Some examples of handheld devices include cellular phones, digital cameras, media players, personal digital assistants (PDAs), and handheld PCs. Embedded applications may include microcontrollers, digital signal processors (DSPs), SOCs, network computers (NetPCs), set-top boxes, network hubs, wide area networks (WANs) switches, or any other system that can perform the functions and operations taught below. Various embodiments of the present disclosure may be used in any suitable computing environment, such as a personal computing device, a server, a mainframe, a cloud computing service provider infrastructure, a datacenter, a communications service provider infrastructure (e.g., one or more portions of an Evolved Packet Core), or other environment comprising one or more computing devices.

FIG. 1 illustrates components of a computer system 100 in accordance with certain embodiments. System 100 includes a central processing unit (CPU) 102 coupled to an external input/output (I/O) controller 104, a storage device 106 such as a solid state drive (SSD), and system memory device 107. During operation, data may be transferred between a storage device 106 and/or system memory device 107 and the CPU 102. In various embodiments, particular memory access operations (e.g., read and write operations) involving a storage device 106 or system memory device 107 may be issued by an operating system and/or other software applications executed by processor 108. In various embodiments, a storage device 106 may include a storage device controller 118 and one or more memory chips 116 that each comprise any suitable number of memory partitions 122.

In various embodiments, a memory partition 122 may include a 3D crosspoint memory array. In some embodiments, a 3D crosspoint memory array may comprise a transistor-less (e.g., at least with respect to the data storage elements of the memory) stackable crosspoint architecture in which memory cells sit at the intersection of row address lines and column address lines arranged in a grid.

In the illustrative embodiment, a memory cell of a 3D crosspoint memory array can be reset by passing a current pulse of a particular current density and duration through the memory cell. The current heats up the memory cell, changing the phase of the memory cell. A brief, high-current density pulse may be used in order to reduce the thermal disturbance of nearby memory cells, which will reduce the raw bit-error rate of the 3D crosspoint memory array. A current source such as a current mirror may be used to provide the desired current density. However, the current source typically passes current through other parts of an electrical path, such as the word line and the bit line, in order to pass current through the selected memory cell. The electrical path refers to the path taken by current flowing from a voltage or current source, through the selected memory cell, and into ground. The capacitance and resistance of the electrical path will depend on the particular memory cell (and thus the particular word line and bit line) that is selected. As such, a current source that is tuned to provide the desired current density at the selected memory cell will first have to charge up the electrical path based on the capacitance of the electrical path, extending the time period required to activate the current source. Over-driving the current source to charge up the electrical path more quickly may prevent the current source from driving the selected memory cell with the desired current density.

In order to address the need to charge up the electrical path, in the illustrative embodiment, a second current source can be used. The second current source can quickly provide additional current to charge up the electrical path and then turn off. The first current source can then provide the tuned current density to the targeted memory cell to perform the desired operation.

CPU 102 comprises a processor 108, such as a microprocessor, an embedded processor, a digital signal processor (DSP), a network processor, a handheld processor, an application processor, a co-processor, an SOC, or other device to execute code (e.g., software instructions). Processor 108, in the depicted embodiment, includes two processing elements (cores 114A and 114B in the depicted embodiment), which may include asymmetric processing elements or symmetric processing elements. However, a processor may include any number of processing elements that may be symmetric or asymmetric. CPU 102 may be referred to herein as a host computing device (though a host computing device may be any suitable computing device operable to issue memory access commands to a storage device 106).

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core 114 (e.g., 114A or 114B) may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

In various embodiments, the processing elements may also include one or more arithmetic logic units (ALUs), floating point units (FPUs), caches, instruction pipelines, interrupt handling hardware, registers, or other hardware to facilitate the operations of the processing elements.

I/O controller 110 is an integrated I/O controller that includes logic for communicating data between CPU 102 and I/O devices. In other embodiments, the I/O controller 110 may be on a different chip from the CPU 102. I/O devices may refer to any suitable devices capable of transferring data to and/or receiving data from an electronic system, such as CPU 102. For example, an I/O device may comprise an audio/video (A/V) device controller such as a graphics accelerator or audio controller; a data storage device controller, such as a magnetic storage disk or optical storage disk controller; a wireless transceiver; a network processor; a network interface controller; or a controller for another input device such as a monitor, printer, mouse, keyboard, or scanner; or other suitable device. In a particular embodiment, an I/O device may comprise a storage device 106 coupled to the CPU 102 through I/O controller 110.

An I/O device may communicate with the I/O controller 110 of the CPU 102 using any suitable signaling protocol, such as peripheral component interconnect (PCI), PCI Express (PCIe), Universal Serial Bus (USB), Serial Attached SCSI (SAS), Serial ATA (SATA), Fibre Channel (FC), IEEE 802.3, IEEE 802.11, or other current or future signaling protocol. In particular embodiments, I/O controller 110 and an associated I/O device may communicate data and commands in accordance with a logical device interface specification such as Non-Volatile Memory Express (NVMe) (e.g., as described by one or more of the specifications available at www.nvmexpress.org/specifications/) or Advanced Host Controller Interface (AHCI) (e.g., as described by one or more AHCI specifications such as Serial ATA AHCI: Specification, Rev. 1.3.1 available at http://www.intel.com/content/www/us/en/io/serial-ata/serial-ata-ahci-spec-rev1-3-1.html). In various embodiments, I/O devices coupled to the I/O controller 110 may be located off-chip (e.g., not on the same chip as CPU 102) or may be integrated on the same chip as the CPU 102.

CPU memory controller 112 is an integrated memory controller that controls the flow of data going to and from one or more system memory devices 107. CPU memory controller 112 may include logic operable to read from a system memory device 107, write to a system memory device 107, or to request other operations from a system memory device 107. In various embodiments, CPU memory controller 112 may receive write requests from cores 114 and/or I/O controller 110 and may provide data specified in these requests to a system memory device 107 for storage therein. CPU memory controller 112 may also read data from a system memory device 107 and provide the read data to I/O controller 110 or a core 114. During operation, CPU memory controller 112 may issue commands including one or more addresses of the system memory device 107 in order to read data from or write data to memory (or to perform other operations). In some embodiments, CPU memory controller 112 may be implemented on the same chip as CPU 102, whereas in other embodiments, CPU memory controller 112 may be implemented on a different chip than that of CPU 102. I/O controller 110 may perform similar operations with respect to one or more storage devices 106.

The CPU 102 may also be coupled to one or more other I/O devices through external I/O controller 104. In a particular embodiment, external I/O controller 104 may couple a storage device 106 to the CPU 102. External I/O controller 104 may include logic to manage the flow of data between one or more CPUs 102 and I/O devices. In particular embodiments, external I/O controller 104 is located on a motherboard along with the CPU 102. The external I/O controller 104 may exchange information with components of CPU 102 using point-to-point or other interfaces.

A system memory device 107 may store any suitable data, such as data used by processor 108 to provide the functionality of computer system 100. For example, data associated with programs that are executed or files accessed by cores 114 may be stored in system memory device 107. Thus, a system memory device 107 may include a system memory that stores data and/or sequences of instructions that are executed or otherwise used by the cores 114. In various embodiments, a system memory device 107 may store temporary data, persistent data (e.g., a user's files or instruction sequences) that maintains its state even after power to the system memory device 107 is removed, or a combination thereof. A system memory device 107 may be dedicated to a particular CPU 102 or shared with other devices (e.g., one or more other processors or other devices) of computer system 100.

In various embodiments, a system memory device 107 may include a memory comprising any number of memory partitions, a memory device controller, and other supporting logic (not shown). A memory partition may include non-volatile memory and/or volatile memory.

Non-volatile memory is a storage medium that does not require power to maintain the state of data stored by the medium, thus non-volatile memory may have a determinate state even if power is interrupted to the device housing the memory. Nonlimiting examples of nonvolatile memory may include any or a combination of: 3D crosspoint memory, phase change memory (e.g., memory that uses a chalcogenide glass phase change material in the memory cells), ferroelectric memory, silicon-oxide-nitride-oxide-silicon (SONOS) memory, polymer memory (e.g., ferroelectric polymer memory), ferroelectric transistor random access memory (Fe-TRAM) ovonic memory, anti-ferroelectric memory, nanowire memory, electrically erasable programmable read-only memory (EEPROM), a memristor, single or multi-level phase change memory (PCM), Spin Hall Effect Magnetic RAM (SHE-MRAM), and Spin Transfer Torque Magnetic RAM (STTRAM), a resistive memory, magnetoresistive random access memory (MRAM) memory that incorporates memristor technology, resistive memory including the metal oxide base, the oxygen vacancy base and the conductive bridge Random Access Memory (CB-RAM), a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory.

Volatile memory is a storage medium that requires power to maintain the state of data stored by the medium (thus volatile memory is memory whose state (and therefore the data stored on it) is indeterminate if power is interrupted to the device housing the memory). Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR3 (double data rate version 3, original release by JEDEC (Joint Electronic Device Engineering Council) on Jun. 27, 2007, currently on release 21), DDR4 (DDR version 4, JESD79-4 initial specification published in September 2012 by JEDEC), DDR4E (DDR version 4, extended, currently in discussion by JEDEC), LPDDR3 (low power DDR version 3, JESD209-3B, August 2013 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5, originally published by JEDEC in January 2020, HBM2 (HBM version 2), originally published by JEDEC in January 2020, or others or combinations of memory technologies, and technologies based on derivatives or extensions of such specifications.

A storage device 106 may store any suitable data, such as data used by processor 108 to provide functionality of computer system 100. For example, data associated with programs that are executed or files accessed by cores 114A and 114B may be stored in storage device 106. Thus, in some embodiments, a storage device 106 may store data and/or sequences of instructions that are executed or otherwise used by the cores 114A and 114B. In various embodiments, a storage device 106 may store persistent data (e.g., a user's files or software application code) that maintains its state even after power to the storage device 106 is removed. A storage device 106 may be dedicated to CPU 102 or shared with other devices (e.g., another CPU or other device) of computer system 100.

In the embodiment depicted, storage device 106 includes a storage device controller 118 and four memory chips 116 each comprising four memory partitions 122 operable to store data, however, a storage device may include any suitable number of memory chips each having any suitable number of memory partitions. A memory partition 122 includes a plurality of memory cells operable to store data. The cells of a memory partition 122 may be arranged in any suitable fashion, such as in rows (e.g., wordlines) and columns (e.g., bitlines), three dimensional structures, sectors, or in other ways. In various embodiments, the cells may be logically grouped into banks, blocks, subblocks, wordlines, pages, frames, bytes, slices, or other suitable groups. In various embodiments, a memory partition 122 may include any of the volatile or non-volatile memories listed above or other suitable memory. In a particular embodiment, each memory partition 122 comprises one or more 3D crosspoint memory arrays. 3D crosspoint arrays are described in more detail in connection with the following figures.

In various embodiments, storage device 106 may comprise a disk drive (e.g., a solid state drive); a memory card; a Universal Serial Bus (USB) drive; a Dual In-line Memory Module (DIMM), such as a Non-Volatile DIMM (NVDIMM); storage integrated within a device such as a smartphone, camera, or media player; or other suitable mass storage device.

In a particular embodiment, one or more memory chips 116 are embodied in a semiconductor package. In various embodiments, a semiconductor package may comprise a casing comprising one or more semiconductor chips (also referred to as dies). A package may also comprise contact pins or leads used to connect to external circuits. In various embodiments, a memory chip may include one or more memory partitions 122.

Accordingly, in some embodiments, storage device 106 may comprise a package that includes a plurality of chips that each include one or more memory partitions 122. However, a storage device 106 may include any suitable arrangement of one or more memory partitions and associated logic in any suitable physical arrangement. For example, memory partitions 122 may be embodied in one or more different physical mediums, such as a circuit board, semiconductor package, semiconductor chip, disk drive, other medium, or any combination thereof.

System memory device 107 and storage device 106 may comprise any suitable types of memory and are not limited to a particular speed, technology, or form factor of memory in various embodiments. For example, a storage device 106 may be a disk drive (such as a solid-state drive), memory integrated with a computing device (e.g., memory integrated on a circuit board of the computing device), a memory module (e.g., a dual in-line memory module) that may be inserted in a memory socket, or other type of storage device. Similarly, system memory 107 may have any suitable form factor. Moreover, computer system 100 may include multiple different types of storage devices.

System memory device 107 or storage device 106 may include any suitable interface to communicate with CPU memory controller 112 or I/O controller 110 using any suitable communication protocol such as a DDR-based protocol, PCI, PCIe, USB, SAS, SATA, FC, System Management Bus (SMBus), or other suitable protocol. In some embodiments, a system memory device 107 or storage device 106 may also include a communication interface to communicate with CPU memory controller 112 or I/O controller 110 in accordance with any suitable logical device interface specification such as NVMe, AHCI, or other suitable specification. In particular embodiments, system memory device 107 or storage device 106 may comprise multiple communication interfaces that each communicate using a separate protocol with CPU memory controller 112 and/or I/O controller 110.

Storage device controller 118 may include logic to receive requests from CPU 102 (e.g., via an interface that communicates with CPU memory controller 112 or I/O controller 110), cause the requests to be carried out with respect to the memory chips 116, and provide data associated with the requests to CPU 102 (e.g., via CPU memory controller 112 or I/O controller 110). Storage device controller 118 may also be operable to detect and/or correct errors encountered during memory operations via an error correction code (ECC engine). In various embodiments, controller 118 may also monitor various characteristics of the storage device 106 such as the temperature or voltage and report associated statistics to the CPU 102. Storage device controller 118 can be implemented on the same circuit board or device as the memory chips 116 or on a different circuit board or device. For example, in some environments, storage device controller 118 may be a centralized storage controller that manages memory operations for multiple different storage devices 106 of computer system 100.

In various embodiments, the storage device 106 also includes program control logic 124 which is operable to control the programming sequence performed when data is written to or read from a memory chip 116. In various embodiments, program control logic 124 may provide the various voltages (or information indicating which voltages should be provided) that are applied to memory cells during the programming and/or reading of data (or perform other operations associated with read or program operations), perform error correction, and perform other suitable functions.

In various embodiments, the program control logic 124 may be integrated on the same chip as the storage device controller 118 or on a different chip. In the depicted embodiment, the program control logic 124 is shown as part of the storage device controller 118, although in various embodiments, all or a portion of the program control logic 124 may be separate from the storage device controller 118 and communicably coupled to the storage device controller 118. For example, all or a portion of the program control logic 124 described herein may be located on a memory chip 116. In various embodiments, reference herein to a "controller" may refer to any suitable control logic, such as storage device controller 118, chip controller 126, or a partition controller. In some embodiments, reference to a controller may contemplate logic distributed on multiple components, such as logic of a storage device controller 118, chip controller 126, and/or a partition controller.

In various embodiments, storage device controller 118 may receive a command from a host device (e.g., CPU 102), determine a target memory chip for the command, and communicate the command to a chip controller 126 of the target memory chip. In some embodiments, the storage device controller 118 may modify the command before sending the command to the chip controller 126.

The chip controller 126 may receive a command from the storage device controller 118 and determine a target memory partition 122 for the command. The chip controller 126 may then send the command to a controller of the determined memory partition 122. In various embodiments, the chip controller 126 may modify the command before sending the command to the controller of the partition 122.

In some embodiments, all or some of the elements of system 100 are resident on (or coupled to) the same circuit board (e.g., a motherboard). In various embodiments, any suitable partitioning between the elements may exist. For example, the elements depicted in CPU 102 may be located on a single die (e.g., on-chip) or package or any of the elements of CPU 102 may be located off-chip or off-package. Similarly, the elements depicted in storage device 106 may be located on a single chip or on multiple chips. In various embodiments, a storage device 106 and a computing host (e.g., CPU 102) may be located on the same circuit board or on the same device and in other embodiments the storage device 106 and the computing host may be located on different circuit boards or devices.

The components of system 100 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g. cache coherent) bus, a layered protocol architecture, a differential bus, and a Gunning transceiver logic (GTL) bus. In various embodiments, an integrated I/O subsystem includes point-to-point multiplexing logic between various components of system 100, such as cores 114, one or more CPU memory controllers 112, I/O controller 110, integrated I/O devices, direct memory access (DMA) logic (not shown), etc. In various embodiments, components of computer system 100 may be coupled together through one or more networks comprising any number of intervening network nodes, such as routers, switches, or other computing devices. For example, a computing host (e.g., CPU 102) and the storage device 106 may be communicably coupled through a network.

Although not depicted, system 100 may use a battery and/or power supply outlet connector and associated system to receive power, a display to output data provided by CPU 102, or a network interface allowing the CPU 102 to communicate over a network. In various embodiments, the battery, power supply outlet connector, display, and/or network interface may be communicatively coupled to CPU 102. Other sources of power can be used such as renewable energy (e.g., solar power or motion based power).

Figure 2:
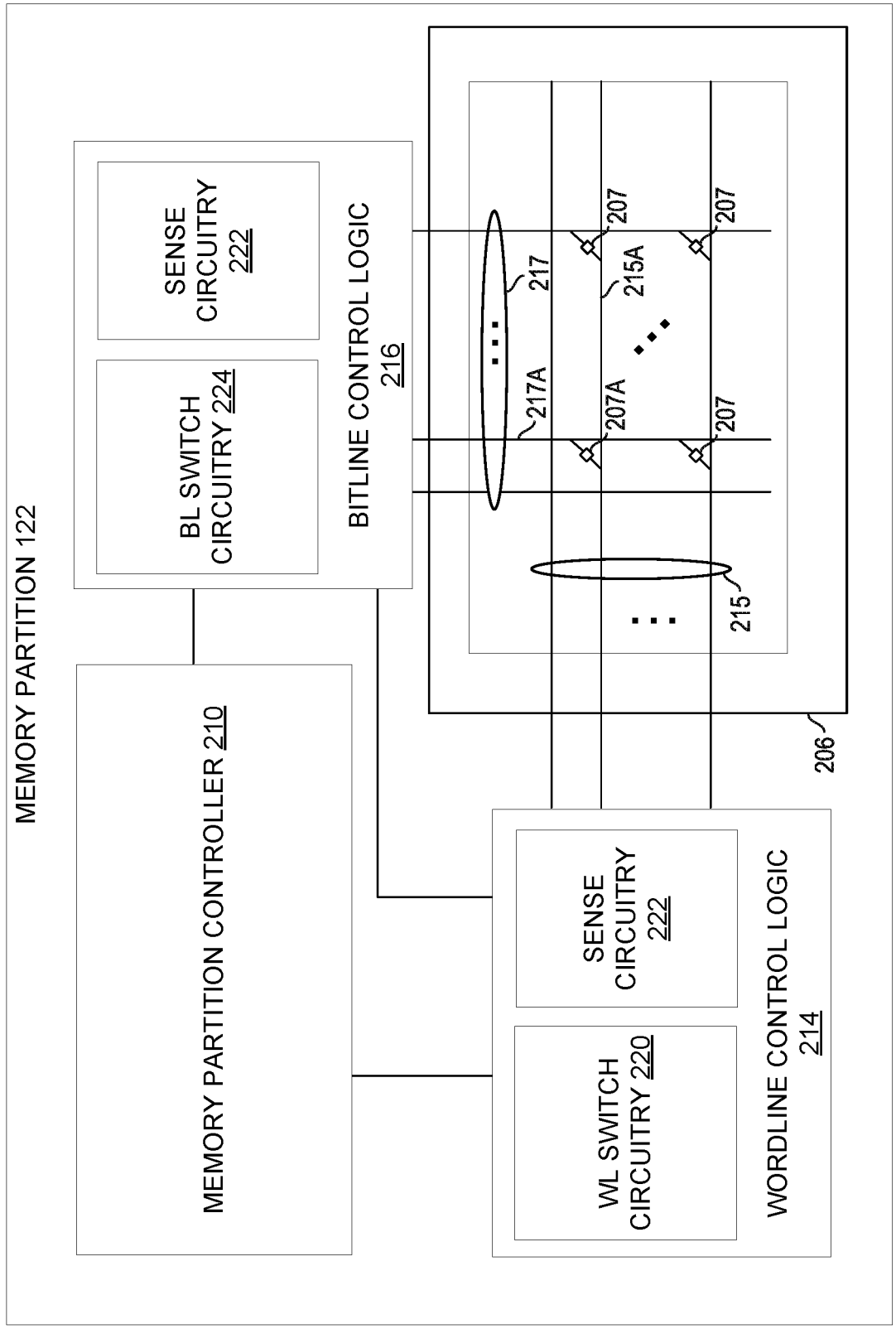
FIG. 2 illustrates a memory partition in accordance with certain embodiments.

FIG. 2 illustrates a detailed exemplary view of the memory partition 122 of FIG. 1 in accordance with certain embodiments. In one embodiment, a memory partition 122 may include 3D crosspoint memory which may include phase change memory or other suitable memory types. In some embodiments, a 3D crosspoint memory array 206 may comprise a transistor-less (e.g., at least with respect to the data storage elements of the memory) stackable crosspoint architecture in which memory cells 207 sit at the intersection of row address lines and column address lines arranged in a grid. The row address lines 215 and column address lines 217, called wordlines (WLs) and bitlines (BLs), respectively, cross in the formation of the grid and each memory cell 207 is coupled between a WL and a BL where the WL and BL cross (e.g., at a crosspoint). At the point of a crossing, the WL and BL may be located at different vertical planes such that the WL crosses over the BL but does not physically touch the BL. As described above, the architecture may be stackable, such that a wordline may cross over a bitline located beneath the wordline and another bitline for another memory cell located above the wordline. It should be noted that row and column are terms of convenience used to provide a qualitative description of the arrangement of WLs and BLs in crosspoint memory. In various embodiments, the cells of the 3D crosspoint memory array may be individually addressable. In some embodiments, bit storage may be based on a change in bulk resistance of a 3D crosspoint memory cell.

FIG. 2 illustrates a memory partition in accordance with certain embodiments. In the embodiment of FIG. 2, a memory partition 122 includes memory partition controller 210, wordline control logic 214, bitline control logic 216, and memory array 206. A host device (e.g., CPU 102) may provide read and/or write commands including memory address(es) and/or associated data to memory partition 122 (e.g., via storage device controller 118 and chip controller 126) and may receive read data from memory partition 122 (e.g., via the chip controller 126 and storage device controller 118). Similarly, storage device controller 118 may provide host-initiated read and write commands or device-initiated read and write commands including memory addresses to memory partition 122 (e.g., via chip controller 126). Memory partition controller 210 (in conjunction with wordline control logic 214 and bitline control logic 216) is configured to perform memory access operations, e.g., reading one or more target memory cells and/or writing to one or more target memory cells.

Memory array 206 corresponds to at least a portion of a 3D crosspoint memory (e.g., that may include phase change memory cells or other suitable memory cells) and includes a plurality of wordlines 215, a plurality of bitlines 217 and a plurality of memory cells, e.g., memory cells 207. Each memory cell is coupled between a wordline ("WL") and a bitline ("BL") at a crosspoint of the WL and the BL.

Memory partition controller 210 may manage communications with chip controller 126 and/or storage device controller 118. In a particular embodiment, memory partition controller 210 may analyze one or more signals received from another controller to determine whether a command sent via a bus is to be consumed by the memory partition 122. For example, controller 210 may analyze an address of the command and/or a value on an enable signal line to determine whether the command applies to the memory partition 122. Controller 210 may be configured to identify one or more target WLs and/or BLs associated with a received memory address (this memory address may be a separate address from the memory partition address that identifies the memory partition 122, although in some embodiments a portion of an address field of a command may identify the memory partition while another portion of the address field may identify one or more WLs and/or BLs). Memory partition controller 210 may be configured to manage operations of WL control logic 214 and BL control logic 216 based, at least in part, on WL and/or BL identifiers included in a received command. Memory partition controller 210 may include memory partition controller circuitry 211, and a memory controller interface 213. Memory controller interface 213, although shown as a single block in FIG. 2, may include a plurality of interfaces, for example a separate interface for each of the WL control logic 214 and the BL control logic 216.

WL control logic 214 includes WL switch circuitry 220 and sense circuitry 222. WL control logic 214 is configured to receive target WL address(es) from memory partition controller 210 and to select one or more WLs for reading and/or writing operations. For example, WL control logic 214 may be configured to select a target WL by coupling a WL select bias voltage to the target WL. WL control logic 214 may be configured to deselect a WL by decoupling the target WL from the WL select bias voltage and/or by coupling a WL deselect bias voltage (e.g., a neutral bias voltage) to the WL. WL control logic 214 may be coupled to a plurality of WLs 215 included in memory array 206. Each WL may be coupled to a number of memory cells corresponding to a number of BLs 217. WL switch circuitry 220 may include a plurality of switches, each switch configured to couple (or decouple) a respective WL, e.g., WL 215A, to a WL select bias voltage to select the respective WL 215A.

BL control logic 216 includes BL switch circuitry 224. In some embodiments, BL control logic 216 may also include sense circuitry, e.g., sense circuitry 222. BL control logic 216 is configured to select one or more BLs for reading and/or writing operations. BL control logic 216 may be configured to select a target BL by coupling a BL select bias voltage to the target BL. BL control logic 216 may be configured to deselect a BL by decoupling the target BL from the BL select bias voltage and/or by coupling a BL deselect bias voltage (e.g., a neutral bias voltage) to the BL. BL switch circuitry 224 is similar to WL switch circuitry 220 except BL switch circuitry 224 is configured to couple the BL select bias voltage to a target BL.

Sense circuitry 222 is configured to detect the state of one or more sensed memory cells 207 (e.g., via the presence or absence of a snap back event during a sense interval), e.g., during a read operation. Sense circuitry 222 is configured to provide a logic level output related to the result of the read operation to, e.g., memory partition controller 210.

As an example, in response to a signal from memory partition controller 210, WL control logic 214 and BL control logic 216 may be configured to select a target memory cell, e.g., memory cell 207A, for a read operation by coupling WL 215A to WL select bias voltage and BL 217A to BL select bias voltage as well as coupling the other WLs and BLs to respective deselect bias voltages. One or both of sense circuitries 222 may then be configured to monitor WL 215A and/or BL 217A for a sensing interval in order to determine the state of the memory cell 207A.

Thus, WL control logic 214 and/or BL control logic 216 may be configured to select a target memory cell for a read operation, initiate the read operation, sense the selected memory cell (e.g., for a snap back event) in a sensing interval, and provide the result of the sensing to, e.g., memory partition controller 210.

In a particular embodiment, the sense circuitry 222 may include a WL load connected to a WL electrode or gate, and a BL load connected to a BL electrode or gate. When a particular wordline and bitline are selected in the array, a difference between WL load or WL voltage and the BL voltage corresponds to a read VDM. VDM may induce a current ($i_{cell}$) 1 in the memory cell 207A dependent on a program state of the memory cell. A comparator such as a sense amplifier may compare $i_{cell}$ with a reference current in order to read a logic state of the memory cell. In this manner, an output of the sense amplifier/comparator may be indicative of a state of the target memory cell. A latch may be coupled to the output of the comparator to store the output of the read operation.

For each matrix of arrays, there may be a number of sense amplifiers provided, with the sense circuitry 222 able to process up to a maximum number of sensed bits, such as 128 bits, from the sense amplifiers at one time. Hence, in one embodiment, 128 memory cells may be sensed at one time by sense amplifiers of the sense circuitry 222.

Figure 3:
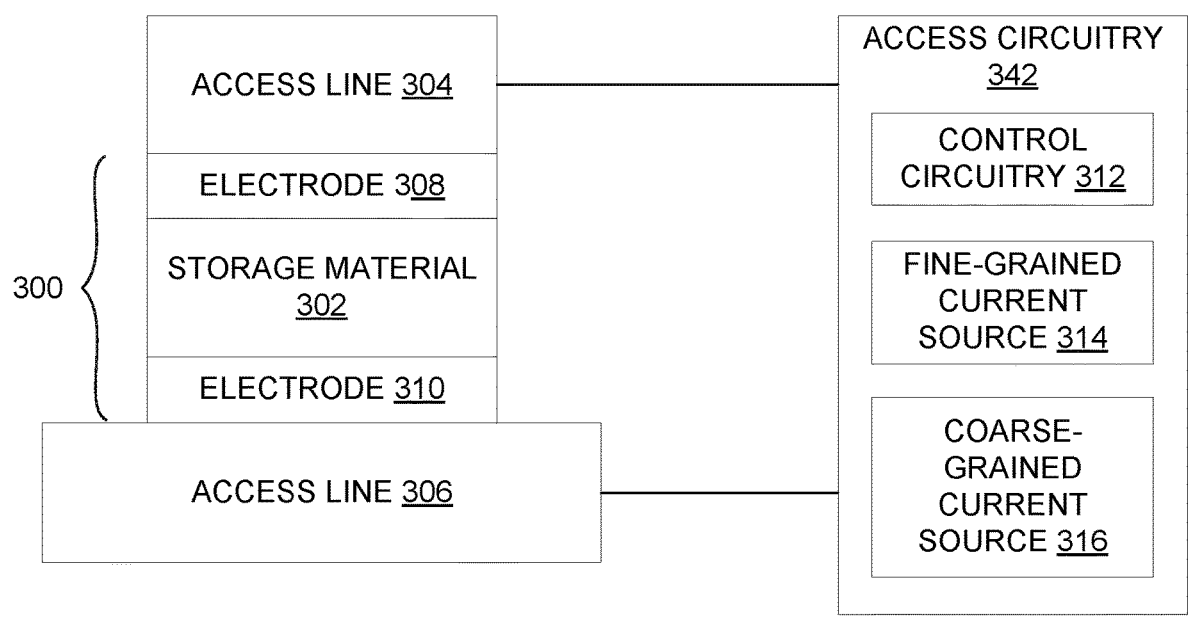
FIG. 3 is a perspective view of portions of a three-dimensional (3D) crosspoint memory stack according to one embodiment.

FIG. 3 illustrates a memory cell 300 coupled to access circuitry 342 in accordance with certain embodiments. The memory cell 300 includes a storage material 302 between access lines 304 and 306. The access lines 304, 306 electrically couple the memory cell 300 with access circuitry 342 that writes to and reads the memory cell 300. For example, access circuitry 342 may include WL switch circuitry 220, BL switch circuitry 224, sense circuitry 222, or other suitable circuitry. The illustrative access circuitry 342 includes control circuitry 312, fine-grained current source 314, and coarse-grained current source 316.

In one embodiment, storage material 302 includes a self-selecting material that exhibits memory effects. A self-selecting material is a material that enables selection of a memory cell in an array without requiring a separate selector element. Thus, storage material 302 may represent a "selector/storage material." A material exhibits memory effects if circuitry (e.g., 342) for accessing memory cells can cause the material to be in one of multiple states (e.g., via a write operation) and later determine the programmed state (e.g., via a read operation). Access circuitry 342 can store information in the memory cell 300 by causing the storage material 302 to be in a particular state. The storage material 302 can include, for example, a chalcogenide material or other material capable of functioning as both a storage element and a selector, to enable addressing a specific memory cell and determining what the state of the memory cell is. Thus, in one embodiment, the memory cell 300 is a self-selecting memory cell that includes a single layer of material that acts as both a selector element to select the memory cell and a memory element to store a logic state. In the embodiment depicted, each memory cell 300 is a two-terminal device (i.e., the memory cell 300 has two electrodes to receive control signals sufficient to write to and read from the memory cell 300).

In other embodiments, each memory cell (e.g., 300) includes a memory element configured to store information and a separate memory cell select device (e.g., selector) coupled to the memory element. Select devices may include ovonic threshold switches, diodes, bipolar junction transistors, field-effect transistors, etc. In one embodiment, a first chalcogenide layer may comprise the memory element and a second chalcogenide layer may comprise the select device.

The storage material 302 may include any suitable material programmable to a plurality of states. In some embodiments, the storage material 302 may include a chalcogenide material comprising a chemical compound with at least one chalcogen ion, that is, an element from group 16 of the periodic table. For example, the storage material 302 may include one or more of: sulfur (S), selenium (Se), or tellurium (Te). Additionally or alternatively, in various embodiments, storage material 302 may comprise germanium (Ge), antimony (Sb), bismuth (Bi), lead (Pb), tin (Sn), indium (In), silver (Ag), arsenic (As), phosphorus (P), molybdenum (Mo), gallium (Ga), aluminum (Al), oxygen (O), nitrogen (N), chromium (Cr), gold (Au), niobium (Nb), palladium (Pd), cobalt (Co), vanadium (V), nickel (Ni), platinum (Pt), titanium (Ti), tungsten (W), tantalum (Ta), or other materials. In various examples, the storage material 302 may include one or more chalcogenide materials such as such as Te—Se, Ge—Te, In—Se, Sb—Te, Ta—Sb—Te, As—Te, As—Se, Al—Te, As—Se—Te, Ge—Sb—Te, Ge—As—Se, Te—Ge—As, V—Sb—Se, Nb—Sb—Se, In—Sb—Te, In—Se—Te, Te—Sn—Se, V—Sb—Te, Se—Te—Sn, Ge—Se—Ga, Mo—Sb—Se, Cr—Sb—Se, Ta—Sb—Se, Bi—Se—Sb, Mo—Sb—Te, Ge—Bi—Te, W—Sb—Se, Ga—Se—Te, Ge—Te—Se, Cr—Sb—Te, Sn—Sb—Te, W—Sb—Te, As—Sb—Te, Ge—Te—Ti, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Se—Te—In, As—Ge—Sb—Te, Se—As—Ge—In, Ge—Sb—Se—Te, Ge—Sn—Sb—Te, Ge—Te—Sn—Ni, Ge—Te—Sn—Pd, and Ge—Te—Sn—Pt, Si—Ge—As—Se, In—Sn—Sb—Te, Ge—Se—Te—Si, Si—Te—As—Ge, Ag—In—Sb—Te, Ge—Se—Te—In—Si, or Se—As—Ge—Si—In. In other various examples, storage material 302 may include other materials capable of being programmed to one of multiple states, such as Ge—Sb, Ga—Sb, In—Sb, Sn—Sb—Bi, or In—Sb—Ge. One or more elements in a chalcogenide material (or other material used as storage material 302) may be dopants. For example, the storage material 302 may include dopants such as: aluminum (Al), oxygen (O), nitrogen (N), silicon (Si), carbon (C), boron (B), zirconium (Zr), hafnium (Hf), or a combination thereof. In some embodiments, the chalcogenide material (or other material used as storage material 302) may include additional elements such as hydrogen (H), oxygen (O), nitrogen (N), chlorine (Cl), or fluorine (F), each in atomic or molecular forms. The storage material 302 may include other materials or dopants not explicitly listed. In some examples, the storage material (such as any of the materials described above) is a phase change material. In other examples, the storage material 302 is not a phase change material, e.g., can be in one or multiple stable states (or transition between stable states) without a change in phase.

In some embodiments, a selector element coupled to storage material (e.g., in non-self-selecting memory cells) may also include a chalcogenide material. A selector device having a chalcogenide material can sometimes be referred to as an Ovonic Threshold Switch (OTS). An OTS may include a chalcogenide composition including any one of the chalcogenide alloy systems described above for the storage element and may further include an element that can suppress crystallization, such as arsenic (As), nitrogen (N), or carbon (C), to name a few. Examples of OTS materials include Te—As—Ge—Si, Ge—Te—Pb, Ge—Se—Te, Al—As—Te, Se—As—Ge—Si, Se—As—Ge—C, Se—Te—Ge—Si, Ge—Sb—Te—Se, Ge—Bi—Te—Se, Ge—As—Sb—Se, Ge—As—Bi—Te, and Ge—As—Bi—Se, among others.

In some embodiments, an element from column III of the periodic table ("Group III element") may be introduced into a chalcogenide material composition to limit the presence of another material (e.g., Ge) in the selector device. For example, a Group III element may replace some or all of the other material (e.g., Ge) in the composition of the selector device. In some embodiments, a Group III element may form a stable, Group III element-centered tetrahedral bond structure with other elements (e.g., Se, As, and/or Si). Incorporating a Group III element into the chalcogenide material composition may stabilize the selector device to allow for technology scaling and increased cross point technology development (e.g., three-dimensional cross point architectures, RAM deployments, storage deployments, or the like).

In one embodiment, each selector device comprises a chalcogenide material having a composition of Se, As, and at least one of B, Al, Ga, In, and Tl. In some cases, the composition of the chalcogenide material comprises Ge or Si, or both.

In one example, the storage material is capable of switching between two or more stable states without changing phase (in other examples the storage material may switch between two stable states by changing phase). In one such embodiment, the access circuitry 342 programs the memory cell 300 by applying one or more program pulses (e.g., voltage or current pulses) with a particular polarity to cause the storage material 302 to be in the desired stable state. In one embodiment, the access circuitry 342 applies program pulses to the access lines 304, 306 (which may correspond to a bitline and a wordline) to write to or read the memory cell 300. In one embodiment, to write to the memory cell 300, the access circuitry applies one or more program pulses with particular magnitudes, polarities, and pulse widths to the access lines 304, 306 to program the memory cell 300 to the desired stable state, which can both select memory cell 300 and program memory cell 300. In various embodiments below, programming states are depicted as being associated with a single programming pulse, however, the single programming pulse may have the same effect as a series of programming pulses that have the effective characteristics of the single programming pulse (e.g., a width of the single programming pulse may be equivalent to the sum of the widths of a series of shorter programming pulses).

In one embodiment, programming the memory cell 300 causes the memory cell 300 to "threshold" or undergo a "threshold event." When a memory cell thresholds (e.g., during application of a program pulse), the memory cell undergoes a physical change that causes the memory cell to exhibit a certain threshold voltage in response to the application of a subsequent voltage (e.g., through application of a read pulse with a particular voltage magnitude and polarity). Programming the memory cell 300 can therefore involve applying a program pulse of a given polarity to induce a programming threshold event and application of current for a duration of time, which causes the memory cell 300 to exhibit a particular threshold voltage at a subsequent reading voltage of a same or different polarity. In one such embodiment, the storage material 302 is a self-selecting material that can be programmed by inducing a threshold event.

During a read operation, access circuitry 342 may determine that a threshold voltage of a memory cell has been reached based on electrical responses to a read voltage applied to the memory cell. Detecting electrical responses can include, for example, detecting a voltage drop (e.g., a threshold voltage) across terminals of a given memory cell of the array or current through the given memory cell. In some cases, detecting whether a threshold voltage for a memory cell has been reached can include determining whether the cell's threshold voltage is lower than or higher than a reference voltage, for example a read voltage. The access circuitry 342 can determine the logic state of the memory cell 300 based on the electrical response of the memory cell to the read voltage pulse.

As mentioned above, the access lines 304, 306 electrically couple the memory cell 300 with circuitry 342. The access lines 304, 306 can be referred to as a bitline and wordline, respectively. The wordline is for accessing a particular word in a memory array and the bitline is for accessing a particular bit in the word. The access lines 304, 306 can be composed of one or more metals including: Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicide nitrides including TiSiN and WSiN; conductive metal carbide nitrides including TiCN and WCN, or any other suitable electrically conductive material.

In one embodiment, electrodes 308 are disposed between storage material 302 and access lines 304, 306. Electrodes 308 electrically couple access lines 304, 306 to storage material 302. Electrodes 308 can be composed of one or more conductive and/or semiconductive materials such as, for example: carbon (C), carbon nitride ($C_xN_y$); n-doped polysilicon and p-doped polysilicon; metals including, Al, Cu, Ni, Mo, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN; conductive metal oxides including $RuO_2$, or other suitable conductive materials. In one embodiment, conductive wordline layer can include any suitable metal including, for example, metals including, Al, Cu, Ni, Mo, Cr, Co, Ru, Rh, Pd, Ag, Pt, Au, Ir, Ta, and W;

conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN, or another suitable electrically conductive material.

The memory cell 300 is one example of a memory cell that may be used as a multi-level cell (storing more than a single logical bit). Other embodiments can include memory cells having additional or different layers of material than illustrated in FIG. 3 (e.g., a selection device between the access line 304 and the storage element, a thin dielectric material between the storage material and access lines, or other suitable configuration).

The illustrative control circuitry 312 is configured to control current provided to the selected memory cell 300 during an operation. The control circuitry 312 may be embodied as hardware, software, firmware, or a combination thereof. For example, the control circuitry 312 may include processor circuitry and memory coupled to the processor. Additionally or alternatively, the control circuitry 312 may be embodied or otherwise include circuitry configured to perform the functions described herein, such as an application specific integrated circuit (ASIC), a field programmable gate array (FPGA), etc. The control circuitry 312 and/or the access circuitry 342 may include, e.g., digital-to-analog converters, analog-to-digital converters, voltage sources, current sources, transistors, etc.

In the illustrative embodiment, the control circuitry 312 is configured to use the fine-grained current source 314 and the coarse-grained current source 316 to provide a current pulse to the selected memory cell 300 to perform an operation. The control circuitry 312 may receive an instruction to perform the operation on the memory cell 300 from, e.g., a chip controller 126, from a storage device controller 118, from a CPU memory controller 112, from a processor 104, from an I/O controller 110, and/or from any other suitable source. The operation may include to read, write, set, or reset the memory cell 300.

The control circuitry 312 may determine the bitline and wordline corresponding to the memory cell 300 and optionally determine properties of the electrical path going through the bitline, the memory cell 300, and the wordline. For example, the control circuitry 312 may determine the resistance and the capacitance for each of the bitline and the wordline. The control circuitry 312 may determine those values in any suitable manner, such as by calculating them based on the dimensions of the bitline and wordline, by looking them up in a table or database, etc. In some embodiments, the control circuitry 312 may not determine the properties of the electrical path (such as capacitance and/or resistance) but rather may simply determine the current needed to perform the selected operation on the selected memory cell 300. For example, the control circuitry 312 may apply a formula, check a database, etc., based on the selected memory cell 300 and the corresponding bitline and wordline to determine one or more parameters for controlling the current sources 314, 316. In one embodiment, the control circuitry 312 may determine an amplitude and/or duration of current to be supplied by the coarse-grained current source 316 by multiplying a length of the electrical path of the bitline by a first pre-determined constant then adding a length of the electrical path of the wordline multiplied by a second pre-determined constant.

The fine-grained current source 314 may be embodied as any suitable fine-grained current source. For example, in the illustrative embodiment, the fine-grained current source 314 may be embodied as a current mirror formed from two or more transistors. The fine-grained current source 314 may be tuned to provide a particular current to perform a desired operation on the memory cell 300. The current source 314 may be fixed at the desired current or may be tunable, such as tunable by the control circuitry 312. The current source 314 may be connected to one or more digital-to-analog converters to allow the control circuitry 312 to control the current source 314. The current source 314 may provide any suitable current amplitude and/or duration, such as any suitable current from 1-100 microamps for 1-100 nanoseconds. In the illustrative embodiment, the current source 314 may provide a current of about 60 microamps for about 10 nanoseconds.

In the illustrative embodiment, the fine-grained current source 314 may drive a current that varies by less than 1 microamp and/or by less than 1% from the nominal current, delivering a consistent, repeatable current pulse to the memory cell 300. As used herein, the nominal current of the fine-grained current source 314 refers to the digitally-controlled current setting of the fine-grained current source 314. In other embodiments, the fine-grained current source 314 may vary by less than 1-5 microamps and/or less than 1-5% from the nominal current. In some embodiments, the fine-grained current source 314 may be tunable by the control circuitry 312 to within 1 microamp. In other embodiments, the fine-grained current source 314 may be tunable within any suitable value, such as 1-5 microamps.

The coarse-grained current source 316 may be embodied as any suitable coarse-grained current source. For example, in the illustrative embodiment, the coarse-grained current source may be embodied as a voltage-controlled resistor, such as a transistor. The gate of the transistor may be connected to a digital-to-analog converter that is connected to or otherwise controlled by the control circuitry 312. By changing the analog voltage applied to the transistor, the control circuitry 312 can control the effective resistance of the transistor, thus controlling the amount of current passing through the coarse-grained current source 316. The coarse-grained current source 316 can provide any suitable current amplitude and/or duration, such as any suitable current from 1-100 microamps for 1-100 nanoseconds. In the illustrative embodiment, the current source 316 provides a current of about 60 microamps for about 2 nanoseconds.

In the illustrative embodiment, the coarse-grained current source 316 may drive a current that varies by up to 5 microamps and/or by up to 5% from the nominal current, delivering a less consistent and/or controllable current as compared to the fine-grained current source 314. In other embodiments, the coarse-grained current source 316 may vary by less than 5-20 microamps and/or less than 5-20% from the nominal current. In some embodiments, the coarse-grained current source 316 may be tunable by the control circuitry 312 to within 5 microamps. In other embodiments, the coarse-grained current source 316 may be tunable within any suitable value, such as 1-20 microamps.

The control circuitry 314 may control the coarse-grained current source 316 in any suitable manner. For example, if the coarse-grained current source 316 is embodied as a voltage-controlled resistor, a current through the coarse-grained current source 316 will be equal to a voltage across the voltage-controlled resistor times the resistance. In one embodiment, where the voltage-controlled resistor is embodied as a transistor, the resistance of the voltage-controlled resistor may correspond to $$R_{VCR} = \frac{1}{C \times (V_{GS} - V_T - V_{DS})},$$

where $R_{VCR}$ is the resistance of the voltage-controlled resistor, $V_{GS}$ is the voltage across the gate and the source of the transistor, $V_T$ is the threshold voltage of the transistor, and $V_{DS}$ is the voltage across the drain and the source of the transistor. The control circuitry 312 can control $V_{GS}$, thus controlling the resistance of the coarse-grained current source 316.

To perform the operation, the control circuitry 312 may activate both the fine-grained current source 314 and the coarse-grained current source 316. The fine-grained current source 314 may provide a current that will be used to perform the desired operation on the memory cell 300. For example, in the illustrative embodiment, the fine-grained current source 314 may provide a current of 60 microamps for 10 nanoseconds. The coarse-grained current source 316 may provide a current that will charge up the capacitance of the electrical path through the memory cell 300. In the illustrative embodiment, the coarse-grained current source 316 may provide a current of 60 microamps for 2 nanoseconds. It should be appreciated that the high current provided by the combination of the coarse-grained current source 316 and the fine-grained current source 314 for the first two nanoseconds (i.e., 120 microamps in the illustrative embodiment) is not the current that passes through the memory cell 300. Rather, some of that current is used to charge the capacitance of the electrical path. As such, in the illustrative embodiment, the joint current provided by the coarse-grained current source 316 and the fine-grained current source 314 may result in the memory cell 300 experiencing a current approximately equal in amplitude and duration to the current provided by the fine-grained current source 314.

Figure 4:
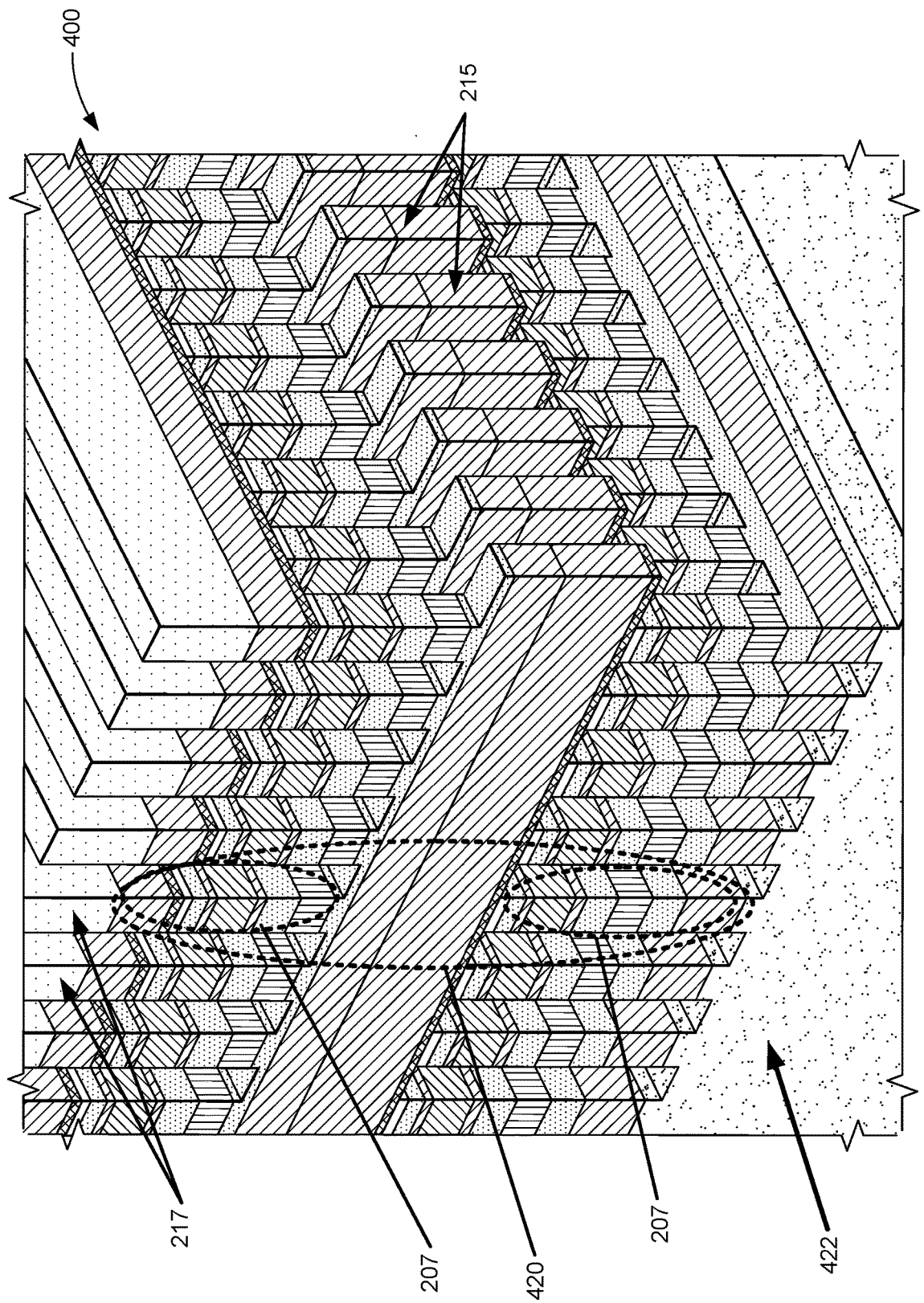
FIG. 4 is a perspective view of a current path though one component of the 3D crosspoint memory stack of FIG. 3.

FIG. 4 is a perspective view of portions of a 3D crosspoint memory stack according to one embodiment. The specific layers are merely examples and will not be described in detail here. Stack 400 is built on substrate structure 422, such as silicon or other semiconductor. Stack 400 includes multiple pillars 420 as memory cell stacks of memory cells 207 or 300. In the diagram of stack 400, it will be observed that the WLs and BLs are orthogonal to each other, and traverse or cross each other in a cross-hatch pattern. A crosspoint memory structure includes at least one memory cell in a stack between layers of BL and WL. As illustrated, wordlines (WL) 215 are in between layers of elements, and bitlines (BL) 217 are located at the top of the circuit. Such a configuration is only an example, and the BL and WL structure can be swapped. Thus, in one representation of stack 400, the WLs can be the metal structures labeled as 217, and the BLs can be the metal structures labeled as 215. Different architectures can use different numbers of stacks of devices, and different configuration of WLs and BLs. It will be understood that the space between pillars 420 is typically an insulator.

Substrate structure 422, such as a silicon substrate, may include control circuitry therein (not shown), such as control circuitry including transistors, row decoders, page buffers, etc. The control circuitry of substrate structure 422 may include, for example, a memory partition controller such as memory partition controller 210, BL control logic such as BL control logic 216, and WL control logic such as WL control logic 214 of FIG. 2, access circuitry 342, or other suitable control circuitry. Each row of WLs 215 extending in the Y direction, the corresponding cells as coupled to corresponding BLs, would define a memory array, and may correspond to a memory array such as memory array 206 of FIG. 2.

Figure 5:
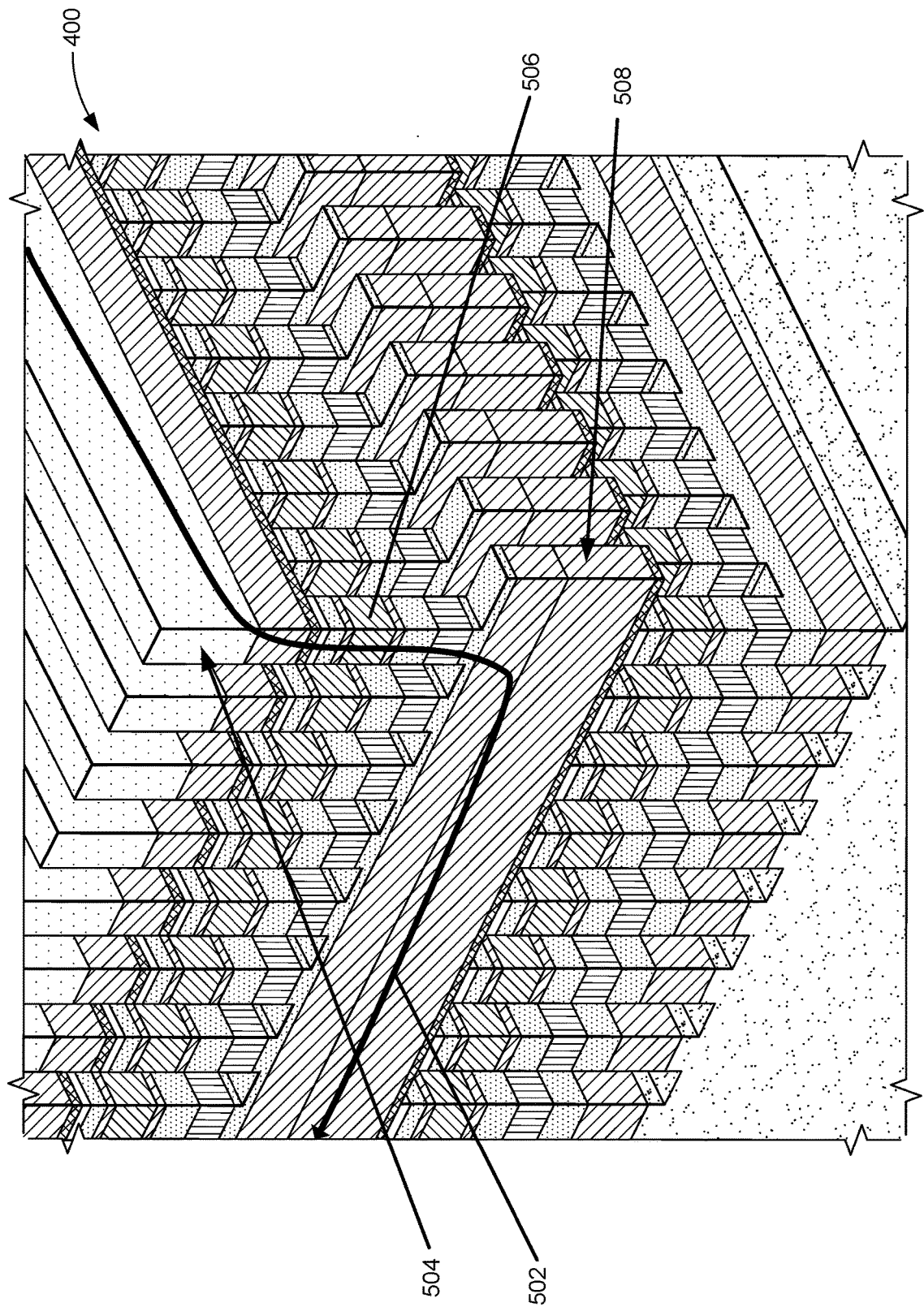
FIG. 5 is a perspective view of a current path though one component of the 3D crosspoint memory stack of FIG. 3.

Referring now to FIG. 5, the stack 400 is shown with a line depicting an electrical path 502 through which current will pass to perform an operation on a memory cell 506. As shown in the figure, the electrical path 502 passes through the bitline 504 corresponding to the memory cell 506, passes through the memory cell 506, then passes through the wordline 508 corresponding to the memory cell 506.

Figure 6:
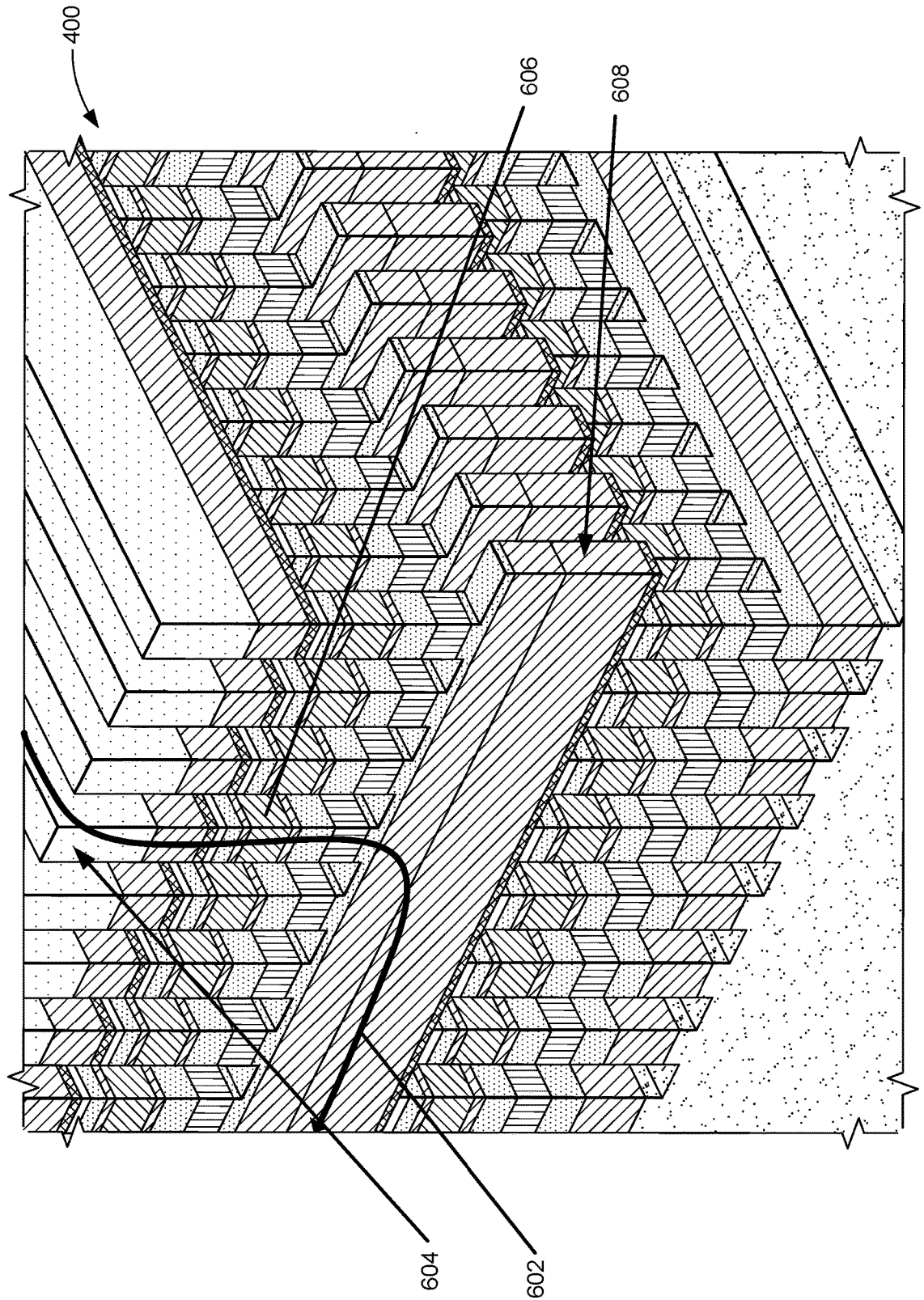
FIG. 6 illustrates a memory cell coupled to access circuitry in accordance with certain embodiments.

Referring now to FIG. 6, the stack 400 is shown with a line depicting an electrical path 602 through which current will pass to perform an operation on a memory cell 606. As shown in the figure, the electrical path 602 passes through the bitline 604 corresponding to the memory cell 606, passes through the memory cell 606, then passes through the wordline 608 corresponding to the memory cell 606. It should be appreciated that the particular electrical path 602 depends on the memory cell 606 being selected. For example, the electrical path 602 for the memory cell 606 is different from the electrical path 502 for the memory cell 506 shown in FIG. 5. It should further be appreciated that various properties of the electrical path 502 may be different from that of the electrical path 602, such as the capacitance due to the wordline, the resistance due to the wordline, the capacitance due to the bitline, and the resistance due to the bitline.

Figure 7:
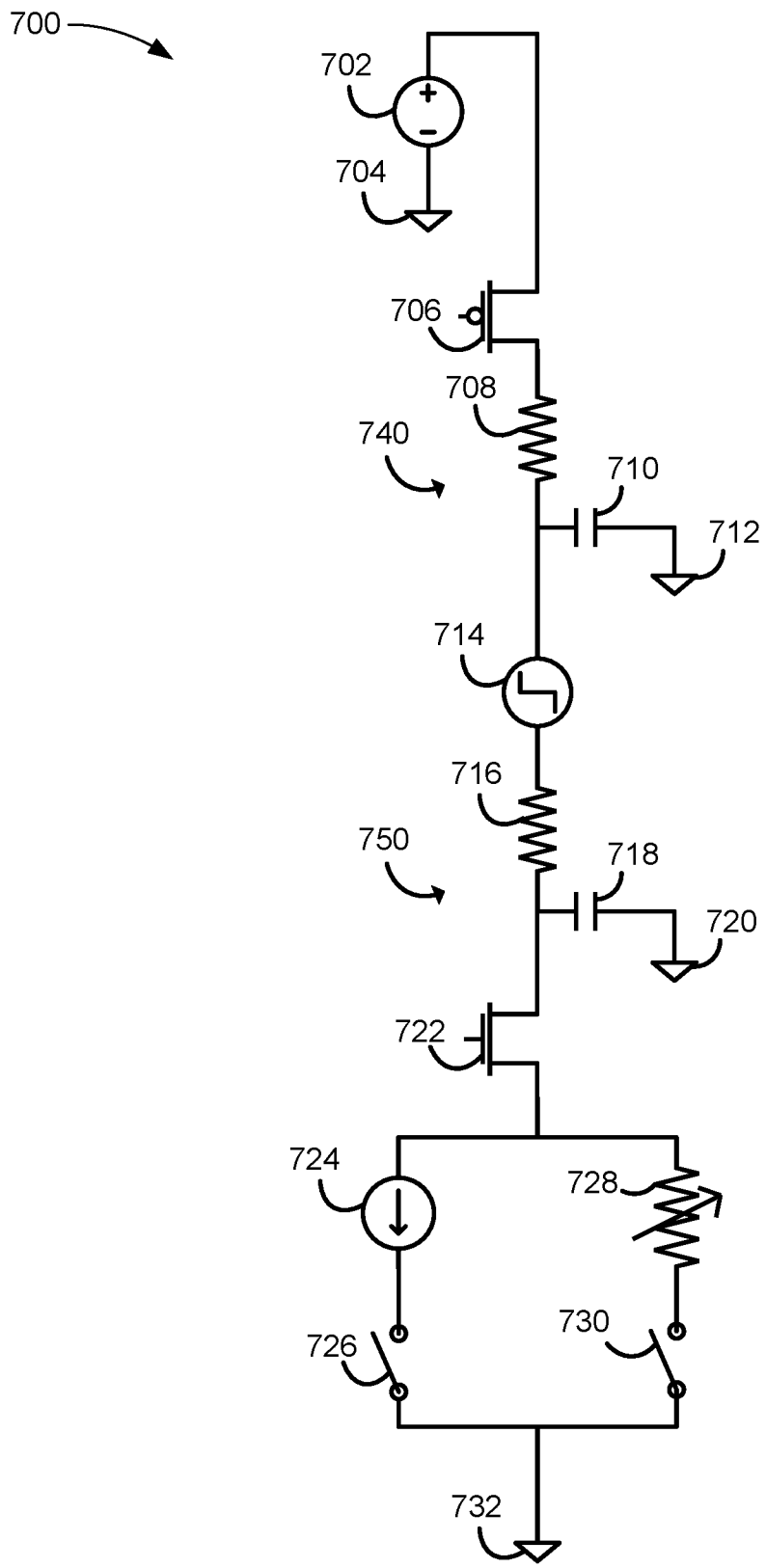
FIG. 7 illustrates a simplified circuit diagram of an electrical path through a memory cell.

Referring now to FIG. 7, in one embodiment, a simplified circuit 700 for performing operations on a memory cell 714 is illustrated. The circuit 700 includes a voltage source 702 with a negative node connected to a circuit ground 704. The positive node of the voltage source 702 is connected to a transistor 706. The transistor 706 acts as a bitline selector to select the bitline 740 corresponding to the memory cell 714. The illustrative transistor 706 is embodied as a p-metal oxide semiconductor (PMOS) transistor. In other embodiments, the transistor 706 may be embodied as, e.g., an NMOS transistor, a PNP or NPN bipolar junction transistor (BJT), an insulated-gate bipolar transistor (IGBT), a junction field-effect transistor (JFET), etc. The gate of the transistor 706 may be connected to or otherwise controlled by the control circuitry 312.

The bitline 740 connects the voltage source 702 to the memory cell 714. The bitline 740 has an inherent resistance represented by resistor 708 and an inherent capacitance represented by capacitor 710, coupled to circuit ground 712. It should be appreciated that the resistor 708 and/or the capacitor 710 may not be separate components but may arise due to the bitline 740 itself.

The memory cell 714 is connected to its corresponding bitline 740 and wordline 750. The memory cell 714 may include the various layers or components of a memory cell, such as those shown in FIGS. 3-6.

The wordline 750 connects the memory cell 714 to the current sources 724, 728. The wordline 750 has an inherent resistance represented by resistor 716 and an inherent capacitance represented by capacitor 718, coupled to circuit ground 720. It should be appreciated that the resistor 716 and/or the capacitor 718 may not be separate components but may arise due to the wordline 750 itself.

The wordline 750 is connected to a transistor 722. The transistor 722 acts as a wordline selector to select the wordline 750 corresponding to the memory cell 714. The illustrative transistor 722 is embodied as an NMOS transistor. In other embodiments, the transistor 722 may be embodied as, e.g., a PMOS transistor, a PNP or NPN BJT, an IGBT, a JFET, etc. The gate of the transistor 722 may be connected to or otherwise controlled by the control circuitry 312.

The transistor 722 is connected to a fine-grained current source 724 and a coarse-grained current source 728. The fine-grained current source 724 may be embodied as any suitable fine-grained current source. For example, in the illustrative embodiment, the fine-grained current source 724 may be embodied as a current mirror formed from two or more transistors. The fine-grained current source 724 may be tuned to provide a particular current to perform a desired operation on the memory cell 714. The current source 724 may be fixed at the desired current or may be tunable, such as tunable by the control circuitry 312. The current source 724 may be connected to one or more digital-to-analog converters to allow the control circuitry 312 to control the current source 724. The current source 724 can provide any suitable current amplitude and/or duration, such as any suitable current from 1-100 microamps for 1-100 nanoseconds. In the illustrative embodiment, the current source 724 provides a current of about 60 microamps for about 10 nanoseconds. The fine-grained current source 724 can be enabled by activating an enabling switch 726. The enabling switch 726 may be embodied as any suitable switch, such as a transistor. The current source 724 and the enabling switch 726 may be connected to or other otherwise controlled by the control circuitry 312. The enabling switch 726 is connected to a circuit ground 732. In some embodiments, the enabling switch 726 may be integrated into or form part of the current source 724.

The coarse-grained current source 728 may be embodied as any suitable coarse-grained current source. For example, in the illustrative embodiment, the coarse-grained current source may be embodied as a voltage-controlled resistor, such as a transistor. The gate of the transistor may be connected to a digital-to-analog converter that is connected to or otherwise controlled by the control circuitry 312. By changing the analog voltage applied to the transistor, the control circuitry 312 can control the effective resistance of the transistor, thus controlling the amount of current passing through the coarse-grained current source 728. The illustrative coarse-grained current source 728 can be digitally programmed to provide any suitable current amplitude and/or duration over any suitable range, such as any suitable current from 1-100 microamps for 1-100 nanoseconds. In the illustrative embodiment, the current source 728 provides a current of about 60 microamps for about 2 nanoseconds. The coarse-grained current source 728 can be enabled by activating an enabling switch 730. The enabling switch 730 may be embodied as any suitable switch, such as a transistor. The current source 728 and the enabling switch 730 may be connected to or other otherwise controlled by the control circuitry 312. The enabling switch 730 is connected to a circuit ground 732. In some embodiments, the enabling switch 730 may be integrated into or form part of the current source 728.

In use, the control circuitry 312 may determine that an operation should be performed on a particular memory cell 714, such as a reset operation. The control circuitry 312 may determine the bitline 740 and wordline 750 corresponding to the memory cell 714 and may further determine properties of the electrical path going through the bitline 740, the memory cell 714, and the wordline 750. For example, the control circuitry 312 may determine the resistance 708, the capacitance 710, the resistance 716, and the capacitance 718. The control circuitry 312 may determine those values in any suitable manner, such as by calculating them based on the dimensions of the bitline 740 and wordline 750, by looking them up in a table or database, etc. In some embodiments, the control circuitry 312 may not determine the properties of the electrical path (such as capacitance and/or resistance) but rather may simply determine the current needed to perform the selected operation on the selected memory cell 714. For example, the control circuitry 312 may apply a formula, check a database, etc., based on the selected memory cell 714 and the corresponding bitline 740 and wordline 750 to determine one or more parameters for controlling the current sources 724, 728. In one embodiment, the control circuitry 312 may determine an amount of charge to supply by the coarse-grained current source 728 by multiplying a length of the electrical path of the bitline 740 by a first pre-determined constant then adding a length of the electrical path of the wordline 750 multiplied by a second pre-determined constant.

The coarse-grained current source 728 may be controlled in any suitable manner. For example, if the coarse-grained current source 728 is embodied as a voltage-controlled resistor, a current through the coarse-grained current source 728 will be equal to a voltage across the voltage-controlled resistor times the resistance. In one embodiment, where the voltage-controlled resistor is embodied as a transistor, the resistance of the voltage-controlled resistor may correspond to $$R_{VCR} = \frac{1}{C \times (V_{GS} - V_T - V_{DS})},$$

where $H_{VCR}$ is the resistance of the voltage-controlled resistor, $V_{GS}$ is the voltage across the gate and the source of the transistor, $V_T$ is the threshold voltage of the transistor, and $V_{DS}$ is the voltage across the drain and the source of the transistor. The control circuitry 312 can control $V_{GS}$, thus controlling the resistance of the coarse-grained current source 728.

To perform the operation, the control circuitry 312 may enable the bitline transistor 706, the wordline transistor 722, the fine-grained current enabling switch 726, and the coarse-grained current enabling switch 730. Each of the fine-grained current source 724 and the coarse-grained current source 728 may then be activated. The fine-grained current source 724 may provide a current that will be used to perform the desired operation on the memory cell 714. For example, in the illustrative embodiment, the fine-grained current source 724 may provide a current of 60 microamps for 10 nanoseconds. The coarse-grained current source 728 may provide a current that will charge up the capacitance of the electrical path through the memory cell 714. In the illustrative embodiment, the coarse-grained current source 728 may provide a current of 60 microamps for 2 nanoseconds. It should be appreciated that the high current provided for the first two nanoseconds (i.e., 120 microamps in the illustrative embodiment) is not the current that passes through the memory cell 714. Rather, some of that current is used to charge the capacitance of the electrical path. As such, in the illustrative embodiment, the joint current provided by the coarse-grained current source 728 and the fine-grained current source 724 may result in the memory cell 714 experiencing a current approximately equal in amplitude and duration to the current provided by the fine-grained current source 724.

After the coarse-grained current source 728 has completed providing its current, the control circuitry 312 turns off the coarse-grained current source 728 and/or opens the enabling switch 730. After the operation on the memory cell 714 is complete, the control circuitry 312 turns off transistors 706 and 722 as well as opening the enabling switch 726 and/or deactivating the fine-grained current source 724. The control circuitry 312 may discharge the charge on the electrical path, such as by turning off transistor 706 before turning off transistor 722 and opening the enabling switch 726. In other embodiments, the control circuitry 312 may simply let the charge on the electrical path dissipate on its own, such as by weak coupling to ground (not shown).

It should be appreciated that, in some embodiments, additional and/or different components may be present that are not shown in the circuit 700, such as additional memory cells, additional wordlines, additional bitlines, additional transistors, additional resistors, etc. Additionally, it should be appreciated that the circuit 700 is merely one possible embodiment, and other embodiments are envisioned as well. For example, the fine-grained current source 724 and/or the coarse-grained current source 728 may be adjacent to the voltage source 702 instead of adjacent to the circuit ground 732, as depicted in FIG. 7. In another example, the circuit 700 may include two or more coarse-grained current sources 728 operating in parallel, each of which can be independently controlled and/or enabled.

Figure 8:
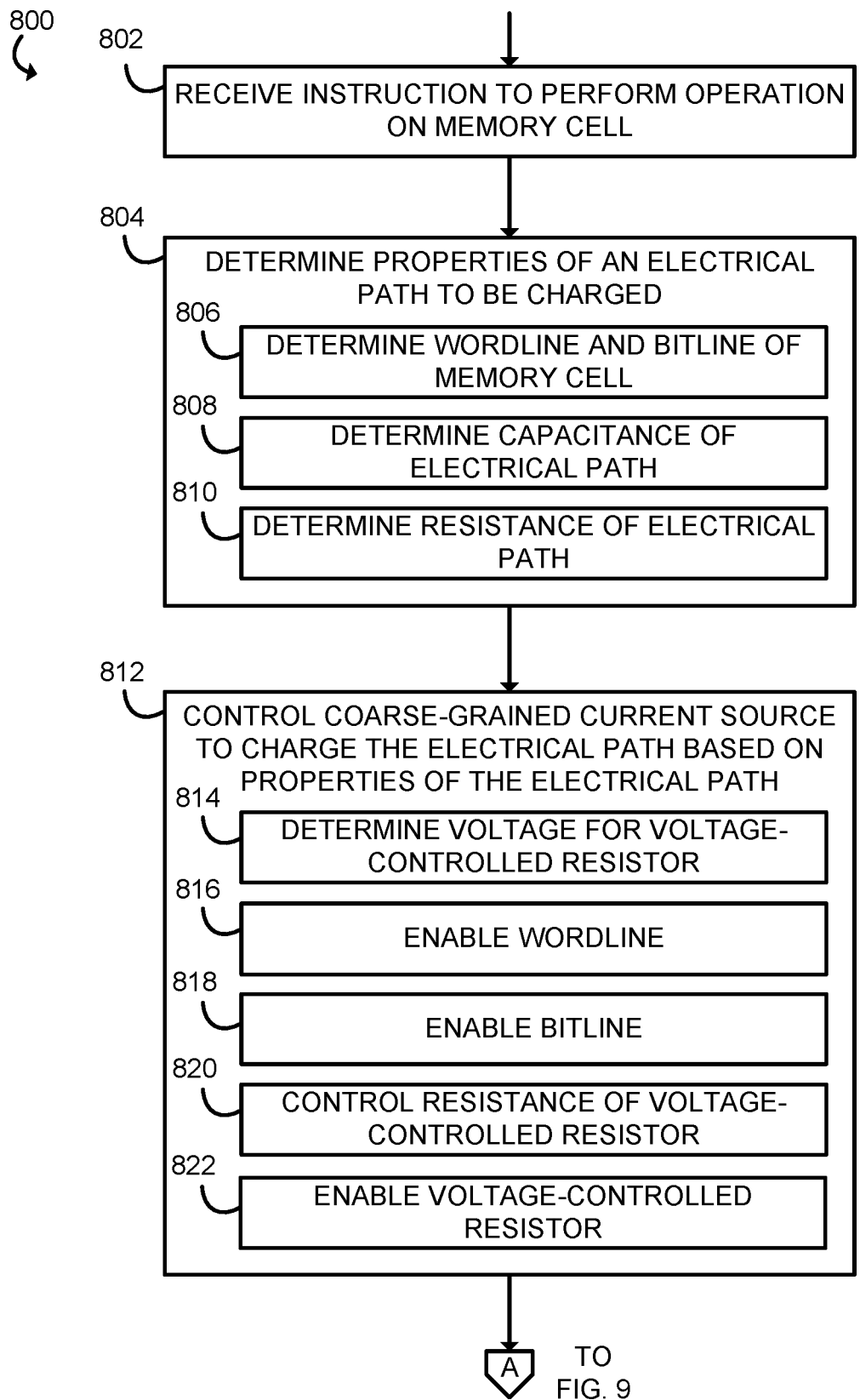
FIGS. 8 & 9 are a simplified flow diagram of at least one embodiment of a method for controlling current through a component.

Referring now to FIG. 8, in use, a system 100 may perform a method 800 for controlling current on memory cells. In some embodiments, some or all of the method 800 may be performed by the control circuitry 312 and components connected to the control circuitry 312. The method 800 begins in block 802, in which the control circuitry 312 receives an instruction to perform an operation on a memory cell, such as the memory cell 714. The control circuitry 312 may, e.g., receive an instruction to perform an operation from a chip controller 126, from a storage device controller 118, from a CPU memory controller 112, from a processor 104, from an I/O controller 110, and/or from any other suitable source. The instruction may be to read, write, set, or reset the memory cell 714.

In block 804, the control circuitry 312 may determine properties of the electrical path going through the selected memory cell 714. The control circuitry 312 may determine the bitline 740 and the wordline 750 in block 806, and use known properties of the bitline 740 and wordline 750 to determine the capacitance of the electrical path in block 808 and the resistance of the electrical path in block 810. The control circuitry 312 may determine those values in any suitable manner, such as by calculating them based on the dimensions of the bitline 740 and wordline 750, by looking them up in a table or database, etc. In some embodiments, the control circuitry 312 may determine one or more parameters that are directly or indirectly indicative of properties of the electrical path through the selected memory cell 714. For example, the control circuitry 312 may not directly determine the properties of the electrical path (such as capacitance and/or resistance) but rather may simply determine the current needed to perform the selected operation on the selected memory cell 714. For example, the control circuitry 312 may apply a formula, check a database, etc., based on the selected memory cell 714 and the corresponding bitline 740 and wordline 750 to determine one or more parameters indicative of one or more properties of the electrical path through the memory cell that can be used for controlling the current sources 724, 728. In one embodiment, the control circuitry 312 may determine an amount of charge to supply by the coarse-grained current source 728 by multiplying a length of the electrical path of the bitline 740 by a first pre-determined constant then adding a length of the electrical path of the wordline 750 multiplied by a second pre-determined constant.

In block 812, the control circuitry 312 controls the coarse-grained current source 728 to charge the electrical path based on properties of the electrical path. In block 814, in the illustrative embodiment, the control circuitry 312 determines a voltage for a voltage-controlled resistor. As discussed above, the resistance of the voltage-controlled resistor may correspond to $$R_{VCR} = \frac{1}{C \times (V_{GS} - V_T - V_{DS})},$$

where $R_{VCR}$ is the resistance of the voltage-controlled resistor, $V_{GS}$ is the voltage across the gate and the source of the transistor, $V_T$ is the threshold voltage of the transistor, and $V_{DS}$ is the voltage across the drain and the source of the transistor. The control circuitry 312 can control $V_{GS}$, thus controlling the resistance of the coarse-grained current source 728. It should be appreciated that, in other embodiments, the control circuitry 312 may determine a voltage or other control signal to apply to the coarse-grained current source 728 in a different manner, depending on the type of current source.

In block 816, the control circuitry 312 enables the wordline corresponding to the memory cell 714, and in block 818, the control circuitry 312 enables the bitline corresponding to the memory cell 714.

In block 820, in the illustrative embodiments, the control circuitry 312 controls the resistance of the voltage-controlled resistor by applying the voltage determined in block 814. In other embodiments, the control circuitry 312 may control a different type of coarse-grained current source 828 by applying an appropriate signal. In block 822, the control circuitry 312 enables the voltage-controlled resistor by closing the enabling switch 730. The coarse-grained current source 728 may provide a current that will charge up the capacitance of the electrical path through the memory cell 714. In the illustrative embodiment, the coarse-grained current source 728 may provide a current of 60 microamps for 2 nanoseconds.

Figure 9:
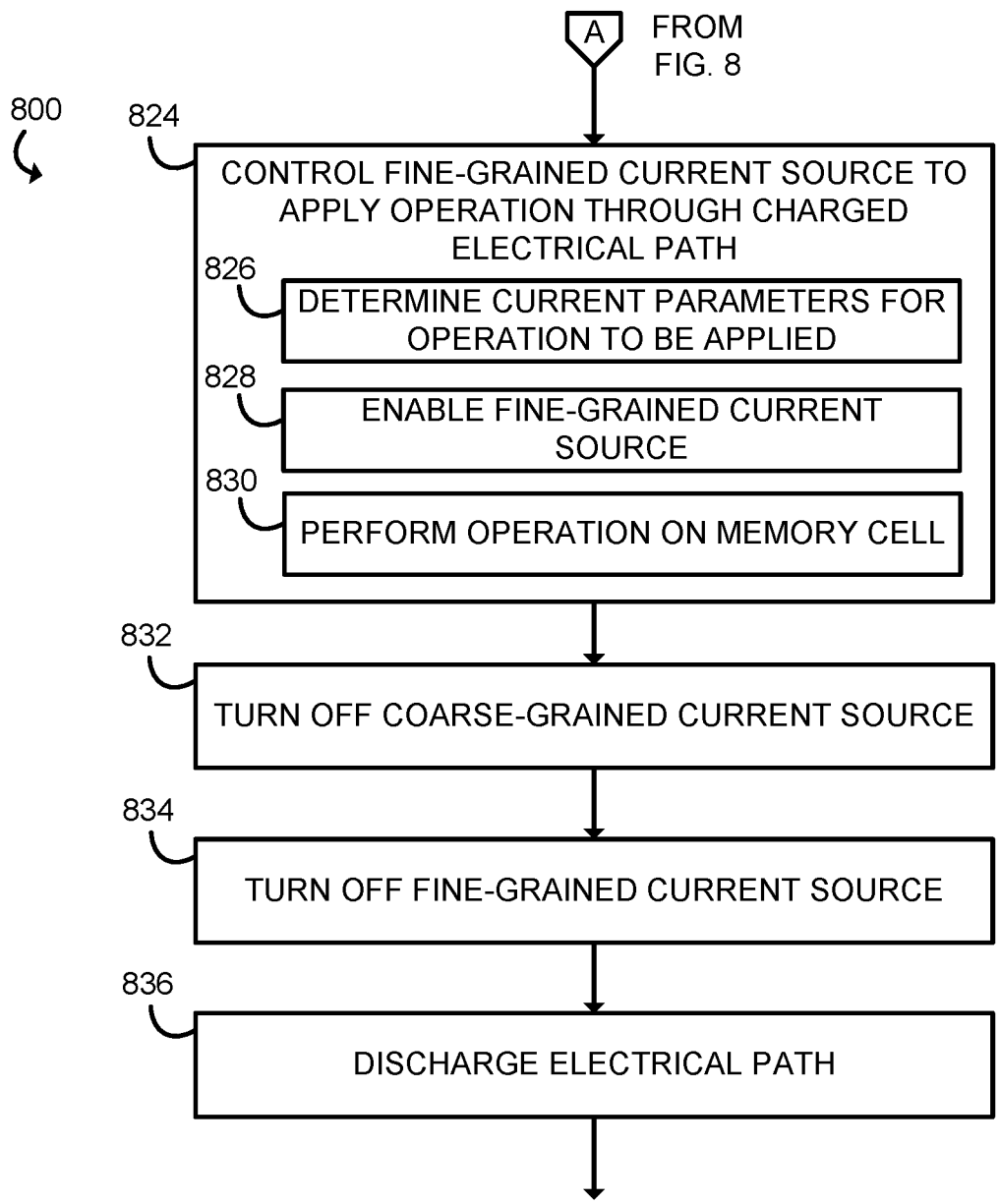

Referring now to FIG. 9, in block 824, the control circuitry 312 controls the fine-grained current source to apply the operation to the memory cell 714 through the charged electrical path. The control circuitry 312 determines current parameters for the operation to be applied in block 826. In some embodiments, the current parameters for the operation to be applied may be pre-determined or otherwise fixed based on the particular operation being applied. For example, the current amplitude and duration may be a pre-determined value for a reset operation, a set operation, or a read operation. In the illustrative embodiment, the current amplitude is approximately 60 microamps and the current duration is approximately 10 nanoseconds for a reset operation. In some embodiments, the current applied may depend on parameters such as a temperature of the memory cell 714, a pre-determined calibration value (such as a calibration value determined at the time of manufacture), etc.

In block 828, the control circuit 312 enables the fine-grained current source 724, such as by closing the enabling switch 726. In block 830, the control circuit 312 performs the operation on the memory cell 714 by supplying the current from the fine-grained current source 724. For example, in the illustrative embodiment, the fine-grained current source 724 may provide a current of 60 microamps for 10 nanoseconds to perform a reset operation. It should be appreciated that the high current provided for the first two nanoseconds (i.e., 120 microamps in the illustrative embodiment) is not the current that passes through the memory cell 714. Rather, some of that current is used to charge the capacitance of the electrical path. As such, in the illustrative embodiment, the joint current provided by the coarse-grained current source 728 and the fine-grained current source 724 may result in the memory cell 714 experiencing a current approximately equal in amplitude and duration to the current provided by the fine-grained current source 724.

In block 832, the control circuit 312 turns off the coarse-grained current source 728. In the illustrative embodiment, the coarse-grained current source 728 and the fine-grained current source 724 are turned on at approximately the same time. In other embodiments, the control circuitry 312 may turn on the coarse-grained current source 728 to charge up the electrical path prior to turning on the fine-grained current source 724, and the control circuitry 312 may turn on the fine-grained current source 724 after the coarse-grained current source 728 has partially or fully delivered its charge.

In block 834, the control circuit 312 turns off the fine-grained current source 724 after the operation is completed, such as by turning off transistor 706 before turning off transistor 722 and opening the enabling switch 726. In other embodiments, the control circuitry 312 may simply let the charge on the electrical path dissipate on its own, such as by weak coupling to ground.

Figure 10:
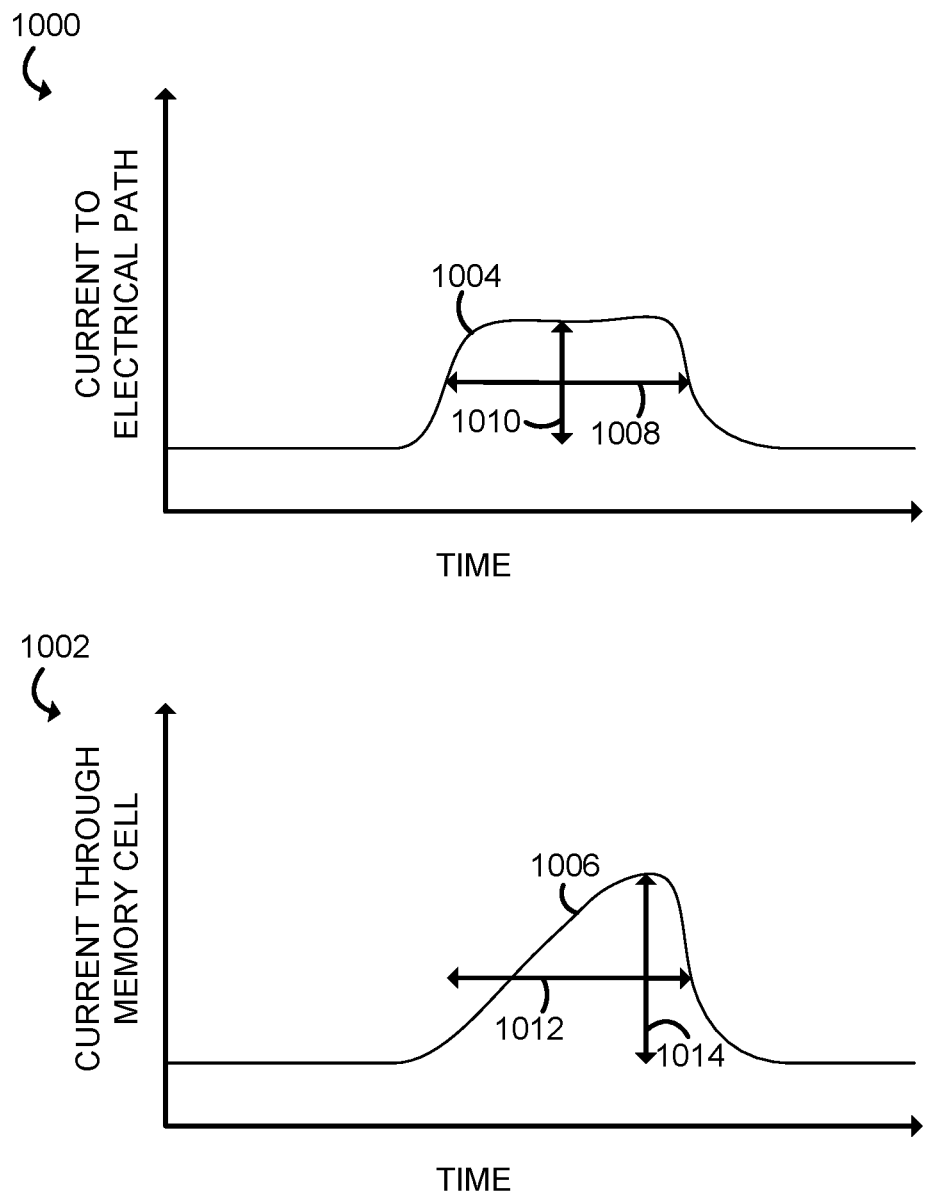
FIG. 10 is an illustration of current through an electrical path and to a component in the electrical path as a function of time for one embodiment of a current source.

Referring now to FIG. 10, in one embodiment, a graph 1000 shows current supplied to an electrical path of a memory cell with only the fine-grained current source 724, and a graph 1002 shows the current that passes through the memory cell when that current is supplied. As shown in the graph 1000, the current 1004 turns on relatively quickly, reaches an amplitude 1010, and maintains that amplitude for approximately the duration 1008 of the pulse, and then returns to a baseline value relatively quickly.

However, due to the capacitance in the electrical path, the current 1006 that passes through the memory cell does not have the same shape. Rather, the initial current supplied by the fine-grained current source 724 goes to charging up the electrical path, resulting in the current 1006 slowly ramping up to an amplitude 1014. Although the duration 1012 of the pulse of the current 1006 may be the same as that of the current 1004, the shape of the pulse of the current 1006 is not flat, extending the time required to perform the desired operation.

Figure 11:
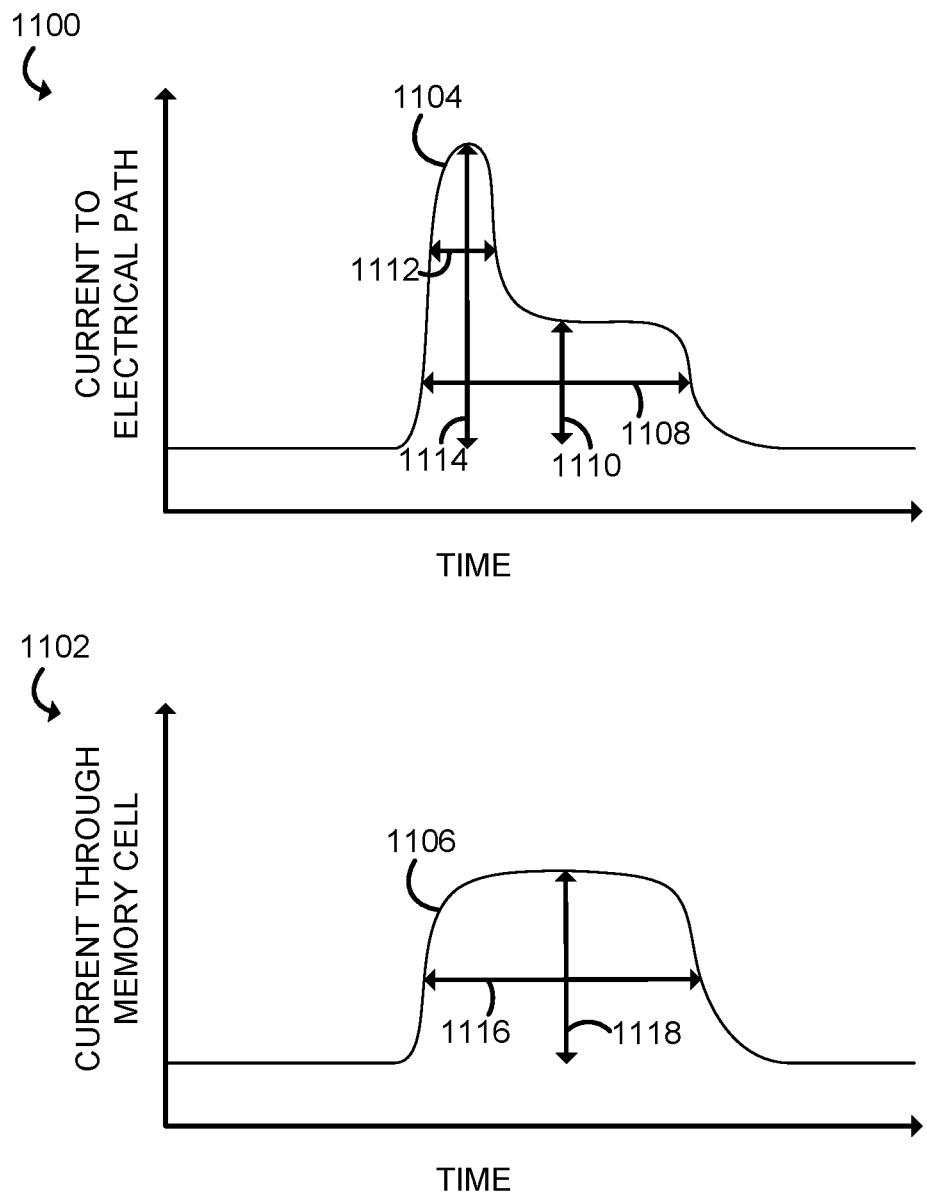
FIG. 11 is an illustration of current through an electrical path and to a component in the electrical path as a function of time for one embodiment of two current sources.

Referring now to FIG. 11, in one embodiment, a graph 1100 shows current supplied to an electrical path of a memory cell with both the fine-grained current source 724 and the coarse-grained current source 728, and a graph 1102 shows the current that passes through the memory cell when that current is supplied. As shown in the graph 1100, the pulse of the current 1104 has a similar duration 1108 to the pulse of the current 1004 as well as a similar amplitude 1110 in the later part of the pulse of the current 1104 as the amplitude 1010 shown in the graph 1000. However, due to the coarse-grained current 728 being on for a short period, the pulse of the current 1104 has an initial peak with a higher amplitude 1114 for a relatively short duration 1112.

As a result, the current 1106 that passes through the memory cell does has a relatively flat pulse shape, similar to the shape of the current through the fine-grained current source 724 as shown in the graph 1000 in FIG. 10. The initial current supplied by the coarse-grained current source 728 charges up the electrical path, resulting in the current from the fine-grained source 724 being approximately equal to the current 1106 passing through the memory cell with duration 116 and amplitude 1118. For example, the amplitude of the pulse for current 1106 through the memory cell may be within 10% of the amplitude of the current 1004 emitted by the fine-grained current source for at least 90% of the duration 1008 of the pulse of the current 1004. More generally, the amplitude of the pulse for current 1106 may be within any suitable value of 0-20% for at least 50-100% of the duration 1008 of the pulse of the current 1004.

Although the illustrative embodiment described above uses a coarse-grained current source and a fine-grained current source to drive a reset pulse to a memory cell, it should be appreciated that other uses of the coarse-grained current source and fine-grained current source are envisioned as well. For example, a coarse-grained current source and a fine-grained current source may be used to drive a read or set pulse to a memory cell. Additionally or alternatively, more generally, a coarse-grained current source may be used to charge an electrical path for any suitable component and a fine-grained current source may be used to drive a current through that component. For example, if a fine-grained current source may be used to drive current through different components that have electrical paths with different capacitances, then a coarse-grained current source may be used to charge up the capacitance of the electrical paths before the fine-grained current source applies a current through the corresponding component in a similar manner as described above.

EXAMPLES

Illustrative examples of the technologies disclosed herein are provided below. An embodiment of the technologies may include any one or more, and any combination of, the examples described below.

Example 1 includes an apparatus for current control on memory cells, the apparatus comprising control circuitry to control a first current source to supply current for a first duration to charge an electrical path through a memory cell; and control a second current source different from the first current source to supply current for a second duration longer than the first duration to perform an operation on the memory cell while the electrical path through the memory cell is charged from the first current source.

Example 2 includes the subject matter of Example 1, and wherein the control circuitry is further to determine one or more parameters indicative of one or more properties of the electrical path through the memory cell, wherein to control the first current source to supply current for the first duration to charge the electrical path through the memory cell comprises to control the first current source to supply, based on the one or more parameters indicative of one or more properties of the electrical path through the memory cell, current for the first duration to charge the electrical path through the memory cell.

Example 3 includes the subject matter of any of Examples 1 and 2, and wherein the first current source is a voltage-controlled resistor, wherein to determine the one or more parameters indicative of the one or more properties of the electrical path through the memory cell comprises to determine a voltage to be applied to the voltage-controlled resistor, wherein to control the first current source comprises to apply the voltage to the voltage-controlled resistor.

Example 4 includes the subject matter of any of Examples 1-3, and wherein the voltage-controlled resistor is a transistor.

Example 5 includes the subject matter of any of Examples 1-4, and wherein the second current source is a current mirror.

Example 6 includes the subject matter of any of Examples 1-5, and wherein to control the first current source to supply current for the first duration comprises to control the first current source to activate for less than 4 nanoseconds, wherein to control the second current source to supply current for the second duration comprises to control the second current source to activate for at least 5 nanoseconds.

Example 7 includes the subject matter of any of Examples 1-6, and wherein to control the first current source comprises to control the first current source to activate for between 1 and 4 nanoseconds at a peak current between 20 and 100 microamps, wherein to control the second current source comprises to control the second current source to activate for between 5 and 20 nanoseconds at a peak current between 20 and 100 microamps.

Example 8 includes the subject matter of any of Examples 1-7, and wherein to control the first current source and the second current source comprises to control the first current source and the second current source such that current through the memory cell is within 10% of the current emitted by the second current source for at least 90% of the duration of a current pulse emitted by the second current source.

Example 9 includes the subject matter of any of Examples 1-8, and wherein the operation on the memory cell is a reset operation.

Example 10 includes the subject matter of any of Examples 1-9, and wherein the operation on the memory cell is a set operation.

Example 11 includes the subject matter of any of Examples 1-10, and wherein the operation on the memory cell is a read operation.

Example 12 includes the subject matter of any of Examples 1-11, and wherein the memory cell is a three-dimensional crosspoint memory cell.

Example 13 includes the subject matter of any of Examples 1-12, and wherein the first current source and the second current source are connected in parallel to a wordline associated with the memory cell.

Example 14 includes a computer system comprising a processor; a memory communicatively coupled to the processor, wherein the memory comprises a plurality of memory cells and control circuitry, wherein the control circuitry is to control a first current source to supply current for a first duration to charge an electrical path through a memory cell of the plurality of memory cells; and control a second current source different from the first current source to supply current for a second duration longer than the first duration to perform an operation on the memory cell while the electrical path through the memory cell is charged from the first current source.

Example 15 includes the subject matter of Example 14, and wherein the control circuitry is further to determine one or more parameters indicative of one or more properties of the electrical path through the memory cell, wherein to control the first current source to supply current for the first duration to charge the electrical path through the memory cell comprises to control the first current source to supply, based on the one or more parameters indicative of one or more properties of the electrical path through the memory cell, current for the first duration to charge the electrical path through the memory cell.

Example 16 includes the subject matter of any of Examples 14 and 15, and wherein the first current source is a voltage-controlled resistor, wherein to determine the one or more parameters indicative of the one or more properties of the electrical path through the memory cell comprises to determine a voltage to be applied to the voltage-controlled resistor, wherein to control the first current source comprises to apply the voltage to the voltage-controlled resistor.

Example 17 includes the subject matter of any of Examples 14-16, and wherein the voltage-controlled resistor is a transistor.

Example 18 includes the subject matter of any of Examples 14-17, and wherein the second current source is a current mirror.

Example 19 includes the subject matter of any of Examples 14-18, and wherein to control the first current source to supply current for the first duration comprises to control the first current source to activate for less than 4 nanoseconds, wherein to control the second current source to supply current for the second duration comprises to control the second current source to activate for at least 5 nanoseconds.

Example 20 includes the subject matter of any of Examples 14-19, and wherein to control the first current source comprises to control the first current source to activate for between 1 and 4 nanoseconds at a peak current between 20 and 100 microamps, wherein to control the second current source comprises to control the second current source to activate for between 5 and 20 nanoseconds at a peak current between 20 and 100 microamps.

Example 21 includes the subject matter of any of Examples 14-20, and wherein to control the first current source and the second current source comprises to control the first current source and the second current source such that current through the memory cell is within 10% of the current emitted by the second current source for at least 90% of the duration of a current pulse emitted by the second current source.

Example 22 includes a method for current control on memory cells, the method comprising controlling, by control circuitry, a first current source to supply current for a first duration to charge an electrical path through a memory cell; and controlling, by the control circuitry, a second current source different from the first current source to supply current for a second duration longer than the first duration to perform an operation on the memory cell while the electrical path through the memory cell is charged from the first current source.

Example 23 includes the subject matter of Example 22, and further including determining, by the control circuitry, one or more parameters indicative of one or more properties of the electrical path through the memory cell, wherein controlling the first current source to supply current for the first duration to charge the electrical path through the memory cell comprises controlling the first current source to supply, based on the one or more parameters indicative of one or more properties of the electrical path through the memory cell, current for the first duration to charge the electrical path through the memory cell.

Example 24 includes the subject matter of any of Examples 22 and 23, and wherein the first current source is a voltage-controlled resistor, wherein determining the one or more parameters indicative of the one or more properties of the electrical path through the memory cell comprises determining a voltage to be applied to the voltage-controlled resistor, wherein controlling the first current source comprises applying the voltage to the voltage-controlled resistor.

Example 25 includes the subject matter of any of Examples 22-24, and wherein the voltage-controlled resistor is a transistor.

Example 26 includes the subject matter of any of Examples 22-25, and wherein the second current source is a current mirror.

Example 27 includes the subject matter of any of Examples 22-26, and wherein controlling the first current source to supply current for the first duration comprises controlling the first current source to activate for less than 4 nanoseconds, wherein controlling the second current source to supply current for the second duration comprises controlling the second current source to activate for at least 5 nanoseconds.

Example 28 includes the subject matter of any of Examples 22-27, and wherein controlling the first current source comprises controlling the first current source to activate for between 1 and 4 nanoseconds at a peak current between 20 and 100 microamps, wherein controlling the second current source comprises controlling the second current source to activate for between 5 and 20 nanoseconds at a peak current between 20 and 100 microamps.

Example 29 includes the subject matter of any of Examples 22-28, and wherein controlling the first current source and the second current source comprises controlling the first current source and the second current source such that current through the memory cell is within 10% of the current emitted by the second current source for at least 90% of the duration of a current pulse emitted by the second current source.

Example 30 includes the subject matter of any of Examples 22-29, and wherein the operation on the memory cell is a reset operation.

Example 31 includes the subject matter of any of Examples 22-30, and wherein the operation on the memory cell is a set operation.

Example 32 includes the subject matter of any of Examples 22-31, and wherein the operation on the memory cell is a read operation.

Example 33 includes the subject matter of any of Examples 22-32, and wherein the memory cell is a three-dimensional crosspoint memory cell.

Example 34 includes one or more computer-readable media comprising a plurality of instructions stored thereon that, when executed, causes control circuitry to perform the method of any of Examples 22-33.

Example 35 includes an apparatus comprising means to perform the method of any of Examples 22-33.

Example 36 includes an apparatus for current control on memory cells, the apparatus comprising means for controlling a first current source to supply current for a first duration to charge an electrical path through a memory cell; and means for controlling a second current source different from the first current source to supply current for a second duration longer than the first duration to perform an operation on the memory cell while the electrical path through the memory cell is charged from the first current source.

Example 37 includes the subject matter of Example 36, and further including means for determining one or more parameters indicative of one or more properties of the electrical path through the memory cell, wherein the means for controlling the first current source to supply current for the first duration to charge the electrical path through the memory cell comprises means for controlling the first current source to supply, based on the one or more parameters indicative of one or more properties of the electrical path through the memory cell, current for the first duration to charge the electrical path through the memory cell.

Example 38 includes the subject matter of any of Examples 36 and 37, and wherein the first current source is a voltage-controlled resistor, wherein the means for determining the one or more parameters indicative of the one or more properties of the electrical path through the memory cell comprises means for determining a voltage to be applied to the voltage-controlled resistor, wherein the means for controlling the first current source comprises means for applying the voltage to the voltage-controlled resistor.

Example 39 includes the subject matter of any of Examples 36-38, and wherein the voltage-controlled resistor is a transistor.

Example 40 includes the subject matter of any of Examples 36-39, and wherein the second current source is a current mirror.

Example 41 includes the subject matter of any of Examples 36-40, and wherein the means for controlling the first current source to supply current for the first duration comprises means for controlling the first current source to activate for less than 4 nanoseconds, wherein the means for controlling the second current source to supply current for the second duration comprises means for controlling the second current source to activate for at least 5 nanoseconds.

Example 42 includes the subject matter of any of Examples 36-41, and wherein the means for controlling the first current source comprises means for controlling the first current source to activate for between 1 and 4 nanoseconds at a peak current between 20 and 100 microamps, wherein the means for controlling the second current source comprises means for controlling the second current source to activate for between 5 and 20 nanoseconds at a peak current between 20 and 100 microamps.

Example 43 includes the subject matter of any of Examples 36-42, and wherein the means for controlling the first current source and the second current source comprises means for controlling the first current source and the second current source such that current through the memory cell is within 10% of the current emitted by the second current source for at least 90% of the duration of a current pulse emitted by the second current source.

Example 44 includes the subject matter of any of Examples 36-43, and wherein the operation on the memory cell is a reset operation.

Example 45 includes the subject matter of any of Examples 36-44, and wherein the operation on the memory cell is a set operation.

Example 46 includes the subject matter of any of Examples 36-45, and wherein the operation on the memory cell is a read operation.

Example 47 includes the subject matter of any of Examples 36-46, and wherein the memory cell is a three-dimensional crosspoint memory cell.

Example 48 includes one or more computer-readable media comprising a plurality of instructions stored thereon that, when executed, causes a compute device to control a first current source to supply current for a first duration to charge an electrical path through a memory cell; and control a second current source different from the first current source to supply current for a second duration longer than the first duration to perform an operation on the memory cell while the electrical path through the memory cell is charged from the first current source.

Example 49 includes the subject matter of Example 48, and wherein the plurality of instructions further causes the compute device to determine one or more parameters indicative of one or more properties of the electrical path through the memory cell, wherein to control the first current source to supply current for the first duration to charge the electrical path through the memory cell comprises to control the first current source to supply, based on the one or more parameters indicative of one or more properties of the electrical path through the memory cell, current for the first duration to charge the electrical path through the memory cell.

Example 50 includes the subject matter of any of Examples 48 and 49, and wherein the first current source is a voltage-controlled resistor, wherein to determine the one or more parameters indicative of the one or more properties of the electrical path through the memory cell comprises to determine a voltage to be applied to the voltage-controlled resistor, wherein to control the first current source comprises to apply the voltage to the voltage-controlled resistor.

Example 51 includes the subject matter of any of Examples 48-50, and wherein the voltage-controlled resistor is a transistor.

Example 52 includes the subject matter of any of Examples 48-51, and wherein the second current source is a current mirror.

Example 53 includes the subject matter of any of Examples 48-52, and wherein to control the first current source to supply current for the first duration comprises to control the first current source to activate for less than 4 nanoseconds, wherein to control the second current source to supply current for the second duration comprises to control the second current source to activate for at least 5 nanoseconds.

Example 54 includes the subject matter of any of Examples 48-53, and wherein to control the first current source comprises to control the first current source to activate for between 1 and 4 nanoseconds at a peak current between 20 and 100 microamps, wherein to control the second current source comprises to control the second current source to activate for between 5 and 20 nanoseconds at a peak current between 20 and 100 microamps.

Example 55 includes the subject matter of any of Examples 48-54, and wherein to control the first current source and the second current source comprises to control the first current source and the second current source such that current through the memory cell is within 10% of the current emitted by the second current source for at least 90% of the duration of a current pulse emitted by the second current source.

Example 56 includes the subject matter of any of Examples 48-55, and wherein the operation on the memory cell is a reset operation.

Example 57 includes the subject matter of any of Examples 48-56, and wherein the operation on the memory cell is a set operation.

Example 58 includes the subject matter of any of Examples 48-57, and wherein the operation on the memory cell is a read operation.

Example 59 includes the subject matter of any of Examples 48-58, and wherein the memory cell is a three-dimensional crosspoint memory cell.

The invention claimed is:

1. An apparatus for current control on memory cells, the apparatus comprising:
 control circuitry to:
  determine one or more parameters indicative of one or more properties of an electrical path through a memory cell;
  control a first current source to supply, based on the one or more parameters indicative of one or more properties of the electrical path through the memory cell, current for a first duration to charge the electrical path through the memory cell; and
  control a second current source different from the first current source to supply current for a second duration longer than the first duration to perform an operation on the memory cell while the electrical path through the memory cell is charged from the first current source.

2. The apparatus of claim 1, wherein the first current source is a voltage-controlled resistor,
 wherein to determine the one or more parameters indicative of the one or more properties of the electrical path through the memory cell comprises to determine a voltage to be applied to the voltage-controlled resistor,
 wherein to control the first current source comprises to apply the voltage to the voltage-controlled resistor.

3. The apparatus of claim 2, wherein the voltage-controlled resistor is a transistor.

4. The apparatus of claim 1, wherein the second current source is a current mirror.

5. The apparatus of claim 1, wherein to control the first current source to supply current for the first duration comprises to control the first current source to activate for less than 4 nanoseconds,
 wherein to control the second current source to supply current for the second duration comprises to control the second current source to activate for at least 5 nanoseconds.

6. The apparatus of claim 5, wherein to control the first current source comprises to control the first current source to activate for between 1 and 4 nanoseconds at a peak current between 20 and 100 microamps,
 wherein to control the second current source comprises to control the second current source to activate for between 5 and 20 nanoseconds at a peak current between 20 and 100 microamps.

7. The apparatus of claim 1, wherein to control the first current source and the second current source comprises to control the first current source and the second current source such that current through the memory cell is within 10% of the current emitted by the second current source for at least 90% of the duration of a current pulse emitted by the second current source.

8. The apparatus of claim 1, wherein the operation on the memory cell is a reset operation.

9. The apparatus of claim 1, wherein the operation on the memory cell is a read operation.

10. The apparatus of claim 1, wherein the memory cell is a three-dimensional crosspoint memory cell.

11. The apparatus of claim 1, wherein the first current source and the second current source are connected in parallel to a wordline associated with the memory cell.

12. A computer system comprising:
 a processor; and
 a memory communicatively coupled to the processor, wherein the memory comprises a plurality of memory cells and control circuitry, wherein the control circuitry is to:
  determine one or more parameters indicative of one or more properties of an electrical path through a memory cell;

control a first current source to supply, based on the one or more parameters indicative of one or more properties of the electrical path through the memory cell, current for a first duration to charge the electrical path through the memory cell of the plurality of memory cells; and control a second current source different from the first current source to supply current for a second duration longer than the first duration to perform an operation on the memory cell while the electrical path through the memory cell is charged from the first current source.

13. The computer system of claim 12, wherein the first current source is a voltage-controlled resistor,
wherein to determine the one or more parameters indicative of the one or more properties of the electrical path through the memory cell comprises to determine a voltage to be applied to the voltage-controlled resistor,
wherein to control the first current source comprises to apply the voltage to the voltage-controlled resistor.

14. The computer system of claim 12, wherein to control the first current source and the second current source comprises to control the first current source and the second current source such that current through the memory cell is within 10% of the current emitted by the second current source for at least 90% of the duration of a current pulse emitted by the second current source.

15. A method for current control on memory cells, the method comprising:

determining, by control circuitry, one or more parameters indicative of one or more properties of an electrical path through a memory cell;

controlling, by the control circuitry, a first current source to supply, based on the one or more parameters indicative of one or more properties of the electrical path through the memory cell, current for a first duration to charge the electrical path through the memory cell; and controlling, by the control circuitry, a second current source different from the first current source to supply current for a second duration longer than the first duration to perform an operation on the memory cell while the electrical path through the memory cell is charged from the first current source.

16. The method of claim 15, wherein the first current source is a voltage-controlled resistor,
wherein determining the one or more parameters indicative of the one or more properties of the electrical path through the memory cell comprises determining a voltage to be applied to the voltage-controlled resistor,
wherein controlling the first current source comprises applying the voltage to the voltage-controlled resistor.

17. The method of claim 15, wherein controlling the first current source and the second current source comprises controlling the first current source and the second current source such that current through the memory cell is within 10% of the current emitted by the second current source for at least 90% of the duration of a current pulse emitted by the second current source.

* * * * *